(12) United States Patent
Jeon et al.

(10) Patent No.: US 11,887,916 B2
(45) Date of Patent: Jan. 30, 2024

(54) SEMICONDUCTOR DEVICES AND METHODS OF MANUFACTURING SEMICONDUCTOR DEVICES

(71) Applicant: Amkor Technology Singapore Holding Pte. Ltd, Valley Point (SG)

(72) Inventors: Hyeong Il Jeon, Gyeonggi-do (KR); Gi Jeong Kim, Gyeonggi-do (KR); Yong Ho Son, Incheon (KR); Byong Jin Kim, Seoul (KR); Jae Min Bae, Seoul (KR); Seung Woo Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 227 days.

(21) Appl. No.: 17/016,077

(22) Filed: Sep. 9, 2020

(65) Prior Publication Data

US 2022/0077031 A1    Mar. 10, 2022

(51) Int. Cl.
*H01L 23/495* (2006.01)
*H01L 23/31* (2006.01)
(Continued)

(52) U.S. Cl.
CPC .... *H01L 23/49548* (2013.01); *H01L 21/4828* (2013.01); *H01L 23/3135* (2013.01);
(Continued)

(58) Field of Classification Search
CPC ..... H01L 21/4828–4832; H01L 21/563; H01L 23/49534; H01L 23/49548;
(Continued)

(56) References Cited

U.S. PATENT DOCUMENTS 5,976,912 A    11/1999   Fukutomi et al.
6,031,291 A    2/2000    Sato et al.
(Continued)

FOREIGN PATENT DOCUMENTS

KR    10-1999-0069507    9/1999
KR    10-2012-0010044    2/2012

*Primary Examiner* — Yu Chen
(74) *Attorney, Agent, or Firm* — Kevin B. Jackson

(57) ABSTRACT

In one example, an electronic device includes a substrate with a conductive structure and a substrate encapsulant. The conductive structure has a lead with a lead via and a lead protrusion. The lead via can include via lateral sides defined by first concave portions and the lead protrusion can include protrusion lateral sides defined by second concave portions. The substrate encapsulant covers the first concave portions at a first side of the substrate but not the second concave portions so that the lead protrusion protrudes from the substrate encapsulant at a second side of the substrate. An electronic component can be adjacent to the first side of the substrate and electrically coupled to the conductive structure. A body encapsulant encapsulates portions of the electronic component and the substrate. In some examples, the lead can further include a lead trace at the second side of the substrate. In some examples, the substrate can include a redistribution structure at the first side of the substrate. Other examples and related methods are also disclosed herein.

14 Claims, 26 Drawing Sheets

(51) Int. Cl.
    *H01L 21/48*    (2006.01)
    *H01L 21/56*    (2006.01)

(52) U.S. Cl.
    CPC .. H01L 23/49527 (2013.01); H01L 23/49534 (2013.01); H01L 23/49558 (2013.01); *H01L 21/563* (2013.01); *H01L 23/49582* (2013.01)

(58) Field of Classification Search
    CPC .......... H01L 23/49558; H01L 23/3135; H01L 23/49527; H01L 23/49582; H01L 23/49861; H01L 23/3107; H01L 23/3121
    See application file for complete search history.

(56) References Cited

U.S. PATENT DOCUMENTS

| | | | |
|---|---|---|---|
| 6,255,740 B1 | 7/2001 | Tsuji et al. | |
| 6,306,685 B1 | 10/2001 | Liu et al. | |
| 6,351,025 B1 | 2/2002 | Ohsawa et al. | |
| 6,384,472 B1 | 5/2002 | Huang et al. | |
| 6,451,627 B1 | 9/2002 | Coffman | |
| 6,476,469 B2 | 11/2002 | Hung et al. | |
| 7,102,214 B1 | 9/2006 | Miks et al. | |
| 7,153,724 B1 | 12/2006 | Sirinorakul et al. | |
| 7,247,938 B2 | 7/2007 | Groenhuis | |
| 7,476,972 B2 | 1/2009 | Takahashi | |
| 8,551,820 B1 | 10/2013 | Foster et al. | |
| 2007/0093000 A1 | 4/2007 | Shim et al. | |
| 2007/0215996 A1 | 9/2007 | Otremba | |
| 2009/0034225 A1 | 2/2009 | Shoji | |
| 2009/0230524 A1* | 9/2009 | Chien | H01L 23/49582 257/676 |
| 2012/0061822 A1 | 3/2012 | Pagaila | |
| 2012/0139104 A1* | 6/2012 | Camacho | H01L 21/4832 257/737 |
| 2012/0146199 A1 | 6/2012 | McMillan et al. | |
| 2013/0154115 A1* | 6/2013 | Camacho | H01L 23/49582 257/777 |
| 2016/0322237 A1* | 11/2016 | Owen | H01L 23/49541 |
| 2019/0067212 A1* | 2/2019 | Cadag | H01L 23/49548 |

\* cited by examiner

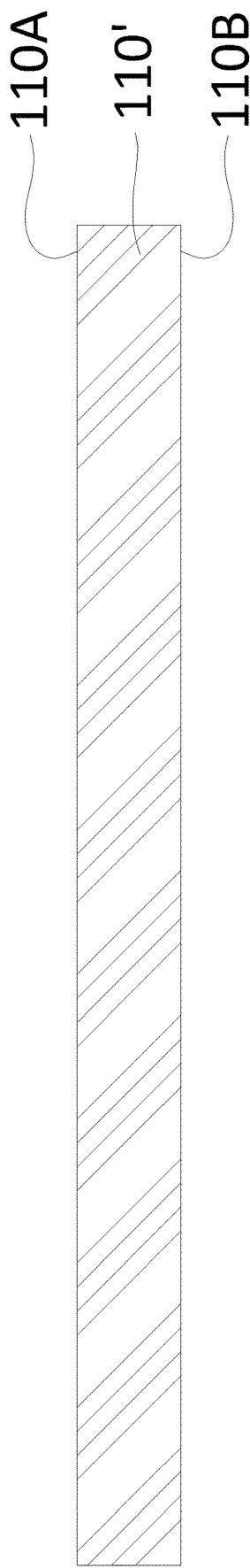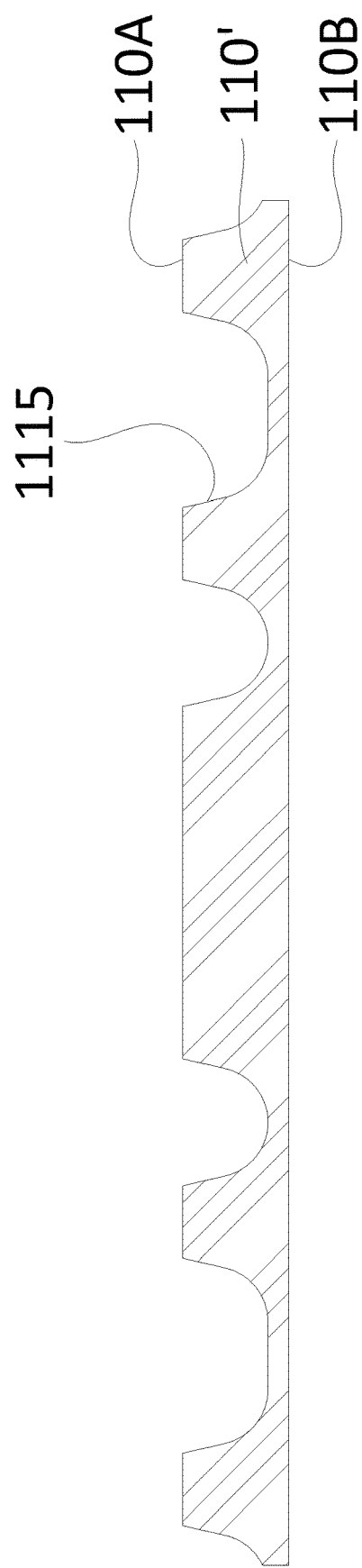
FIG.2A
FIG.2B

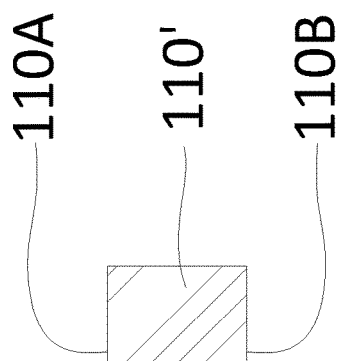
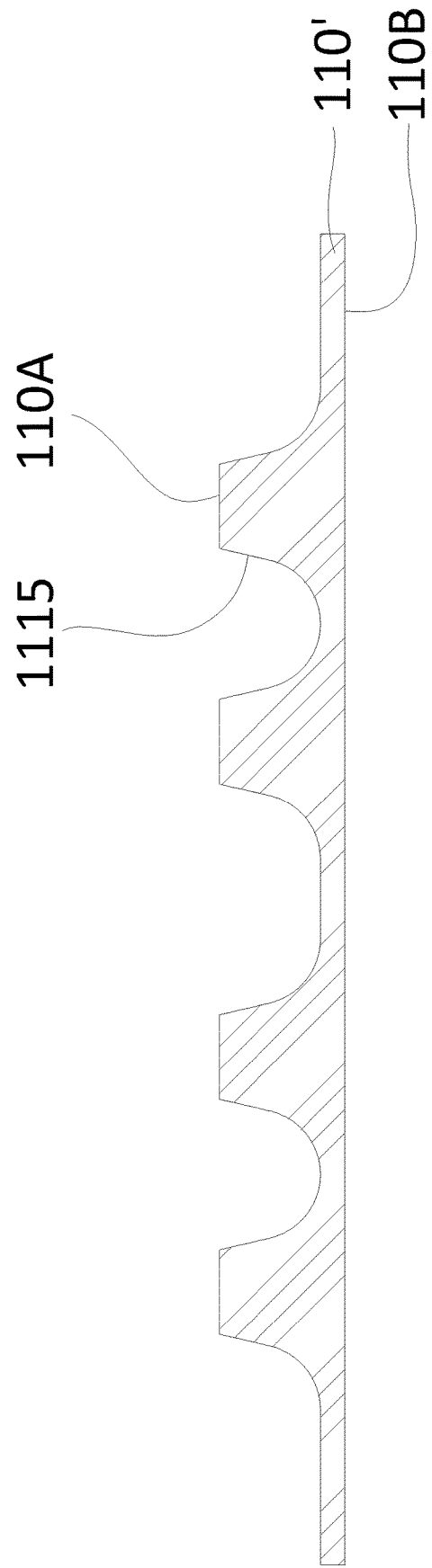
FIG.4A
FIG.4B

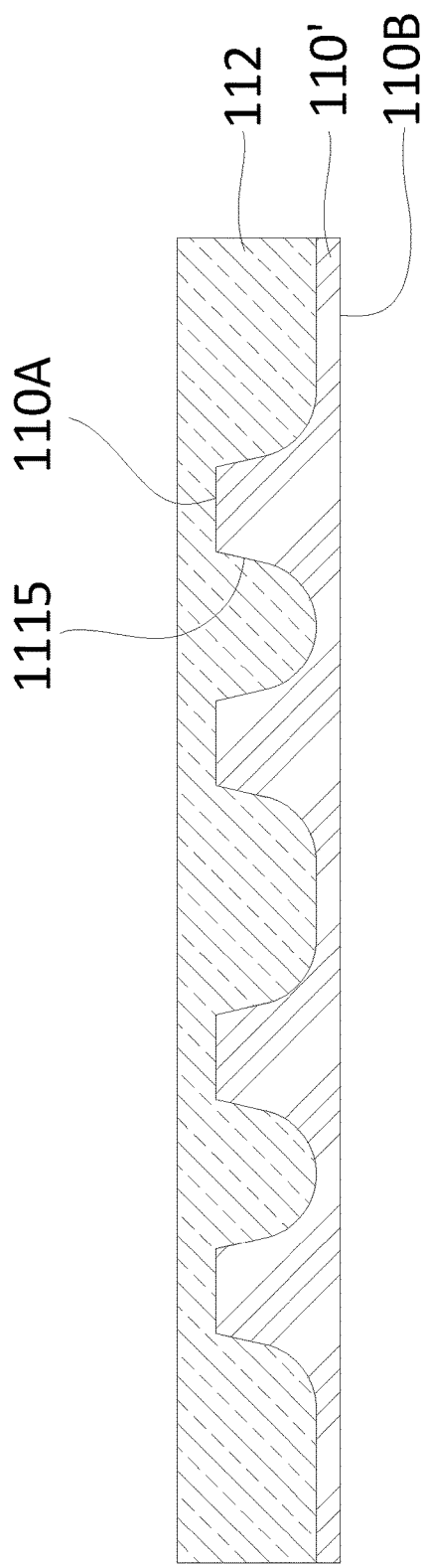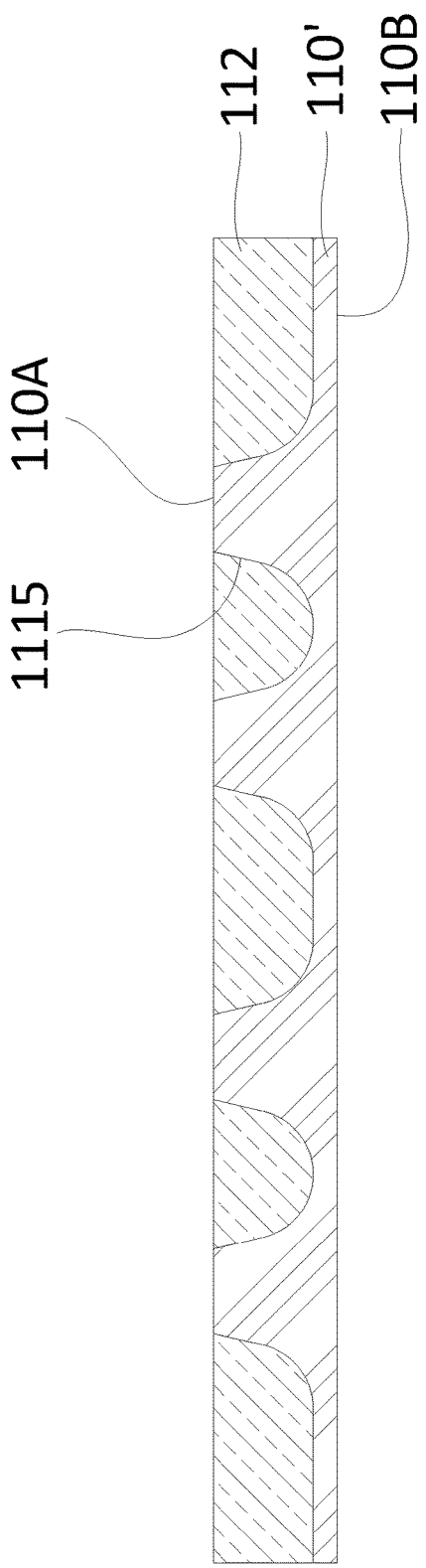
FIG.4C
FIG.4D

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2G, and 2H show cross-sectional views of an example method for manufacturing an example electronic device.

FIGS. 4A, 4B, 4C, 4D, 4E, 4F, 4G, and 4H show cross-sectional views of an example method for manufacturing an example electronic device.

Figure 1:
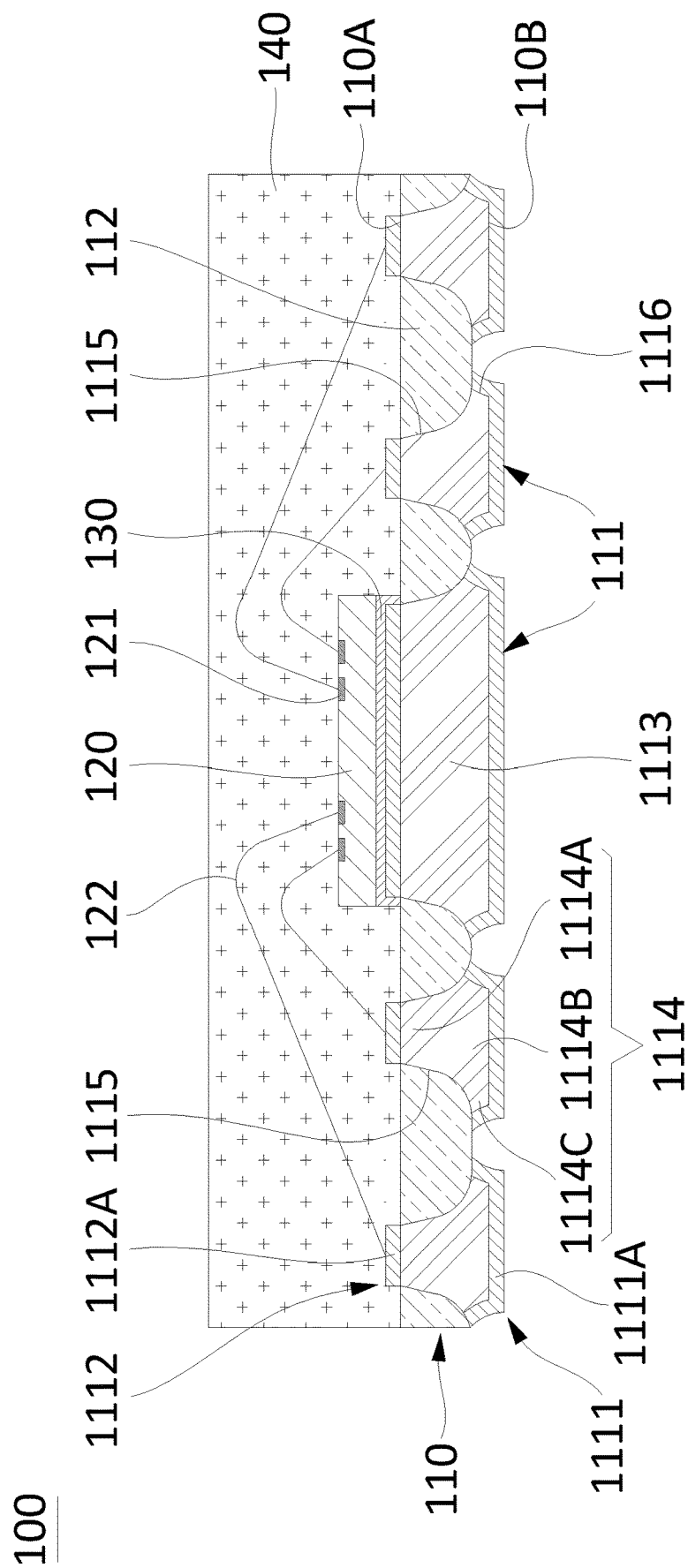
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

The present description includes, among other features, electronic devices and associated methods that include a substrate comprising a lead, the lead having a lead via at a first side of the substrate and a lead protrusion at a second and opposite side of the substrate. The substrate includes a substrate encapsulant that covers via lateral sides of the lead via. The lead protrusion protrudes outward from the substrate encapsulant at the second side. In some examples, the lead further includes a lead trace coupled to the lead protrusion at the second side to route electrical signals to and from an electronic component disposed at the first side of the substrate. In some examples, a redistribution structure is included at the first side of the substrate to route electrical signals to and from the electronic component disposed at the first side of the substrate.

More particularly, in an example, a semiconductor device comprises a substrate comprising a first side, a second side opposite to the first side, a conductive structure comprising a lead having a lead via and a lead protrusion, and a substrate encapsulant. The lead via comprises via lateral sides defined by first concave portions, the lead protrusion comprises protrusion lateral sides defined by second concave portions, and the substrate encapsulant covers the first concave portions at the first side of the substrate but not the second concave portions so that the lead protrusion protrudes from the substrate encapsulant at the second side of the substrate. A semiconductor component is adjacent to the first side of the substrate and electrically coupled to the conductive structure, the semiconductor component comprising a first component side distal to the first side of the substrate, a second component side proximate to the first side of the substrate, and lateral component sides extending between the first component side and the second component side to define a footprint of the semiconductor component. A body encapsulant encapsulates the first component side and the lateral component sides of the semiconductor component.

In an example, a semiconductor device comprises a substrate comprising a first side, a second side opposite to the first side, a conductive structure, and a substrate encapsulant. The conductive structure comprises a lead including a lead via having via lateral sides and a lead protrusion having protrusion lateral sides, a first terminal layer coupled to the lead via adjacent to the first side of the substrate, and a second terminal layer coupled to the lead protrusion adjacent to the second side of the substrate. The via lateral sides are defined by first concave portions and the protrusion lateral sides are defined by second concave portions. The substrate encapsulant covers the first concave portions at the first side of the substrate but not the second concave portions so that the lead protrusion protrudes from the substrate encapsulant at the second side of the substrate. The second terminal layer covers the second concave portions. The first terminal layer and the lead via define an internal terminal and the second terminal layer and the lead protrusion define an external terminal. A semiconductor component is adjacent to the first side of the substrate and electrically coupled to the internal terminal. A body encapsulant encapsulates a first component side and lateral component sides of the semiconductor component.

In an example, a method of making a semiconductor device comprises providing a substrate comprising a first side, a second side opposite to the first side, a conductive structure, and a substrate encapsulant. The conductive structure comprises a lead comprising a lead via having via lateral sides and a lead protrusion having protrusion lateral sides, a first terminal layer coupled to the lead via adjacent to the first side, and a second terminal layer coupled to the lead protrusion adjacent to the second side. The via lateral sides are defined by first concave portions, the protrusion lateral sides are defined by second concave portions, the substrate encapsulant covers the first concave portions at the first side of the substrate but not the second concave portions so that the lead protrusion protrudes from the substrate encapsulant at the second side of the substrate, the second terminal layer covers the second concave portions, the first terminal layer and the lead via define an internal terminal, and the second terminal layer and the lead protrusion define an external terminal. The method includes coupling a semiconductor component adjacent to the first side of the substrate and electrically coupled to the internal terminal. The method includes encapsulating with a body encapsulant a first component side and lateral component sides of the semiconductor component.

Other examples are included in the present disclosure. Such examples may be found in the figures, in the claims, or in the description of the present disclosure.

FIG. 1 shows a cross-sectional view of an example electronic device. In the example shown in FIG. 1, electronic device 100 can comprise substrate 110, electronic component 120, interface material 130 and body encapsulant 140.

Substrate 110 can comprise conductive structure 111 and substrate encapsulant 112. Conductive structure 111 can comprise external terminal 1111, internal terminal 1112, paddle 1113, lead 1114 and concave portions 1115 and 1116. External terminal 1111 and internal terminal 1112 can comprise terminal platings 1111A and 1112A, respectively. Lead 1114 can comprise lead via 1114A, lead protrusion 1114B and lead trace 1114C. Electronic component 120 can comprise component terminal 121 and component interconnect 122.

Substrate 110, interface material 130 and body encapsulant 140 can be referred to as a semiconductor package or a package, and it can provide protection for electronic component 120 from external elements or environmental exposure. The semiconductor package can provide an electrical coupling between an external component and electronic component 120.

Figure 2C:
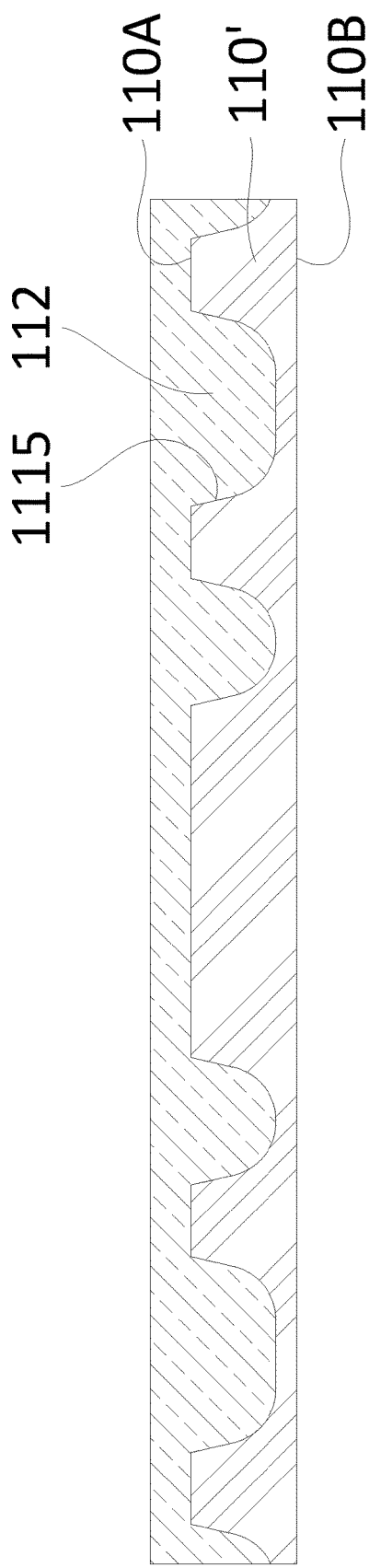

FIGS. 2A to 2H show cross-sectional views of an example method for manufacturing an example electronic device. FIG. 2A shows a cross-sectional view of electronic device 100 at an early stage of manufacture.

In the example shown in FIG. 2A, raw substrate 110' having first side 110A and second side 110B opposite to first side 110A can be prepared. In some examples, raw substrate 110' can be made of a metal. For example, raw substrate 110' can comprise copper, a copper alloy designated by C19210, C19400 or C70250, nickel, a nickel alloy, iron, an iron-nickel alloy. Raw substrate 110' can be a basic plate material for forming substrate 110. In some examples, the thickness of raw substrate 110' can range from about 100 μm to about 300 μm.

FIG. 2B shows a cross-sectional view of electronic device 100 at a later stage of manufacture. In the example shown in FIG. 2B, concave portions 1115 can be formed by partial-etching first side 110A of raw substrate 110'. Concave portions 1115 can be formed as grooves each having a predetermined depth inwardly recessed from first side 110A of raw substrate 110'. In some examples, the depth of each concave portion 1115 can range from about 75 μm to about 225 μm. In some examples, the depth of concave portion 1115 can be about 75% or more of the depth of raw substrate 10'. Concave portions 1115 can be spaced apart from each other and can have different widths. Concave portions 1115 can define portions of lateral sides of paddle 1113 or lead 1114. In some examples, concave portions 1115 define via lateral sides of lead via 1114A. In some examples, concave portions 1115 can be formed by a dry etching process such as plasma etching, reactive ion etching (RIE) or sputter etching, or by a wet etching process such as immersion or spraying.

FIG. 2C shows a cross-sectional view of electronic device 100 at a later stage of manufacture. In the example shown in FIG. 2C, substrate encapsulant 112 can encapsulate first side 110A of raw substrate 110'. In some examples, substrate encapsulant 112 can cover first side 110A while filling concave portions 1115. Substrate encapsulant 112 can comprise or be referred to as a mold material, a protective material, a mold compound, or a resin. In some examples, substrate encapsulant 112 can comprise a fiber-free encapsulant, a resin without filler reinforcement material, or a mold material with an inorganic filler reinforcement material. Substrate encapsulant 112 can be formed by a variety of processes including, for example, a liquid phase encapsulant molding process, a compression molding process, a vacuum lamination process, a paste printing process, or a film assisted molding process.

Figure 2D:
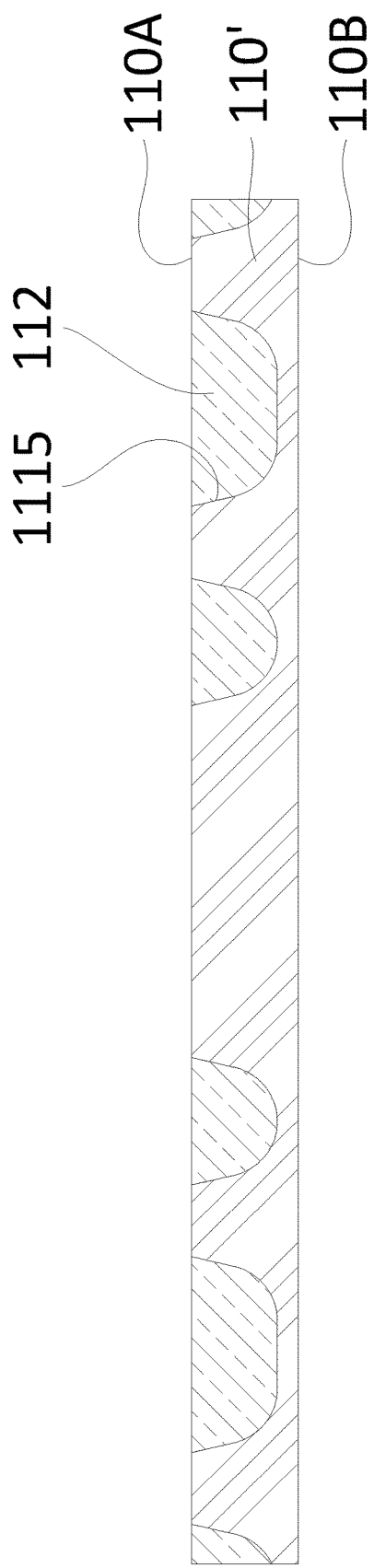

FIG. 2D shows a cross-sectional view of electronic device 100 at a later stage of manufacture. In the example shown in FIG. 2D, first side 110A of raw substrate 110' can be exposed by grinding the top portion of substrate encapsulant 112. In some examples, part of substrate encapsulant 112 can be removed by mechanical grinding or laser grinding. Substrate encapsulant 112 can insulate paddle 1113 and lead 1114 from each other or can insulate neighboring leads 1114 from each other. Substrate encapsulant 112 can provide reinforcement for substrate 110 to maintain structural integrity compensating for material removed or etched when defining concave portions 1115 or 1116.

Figure 2E:
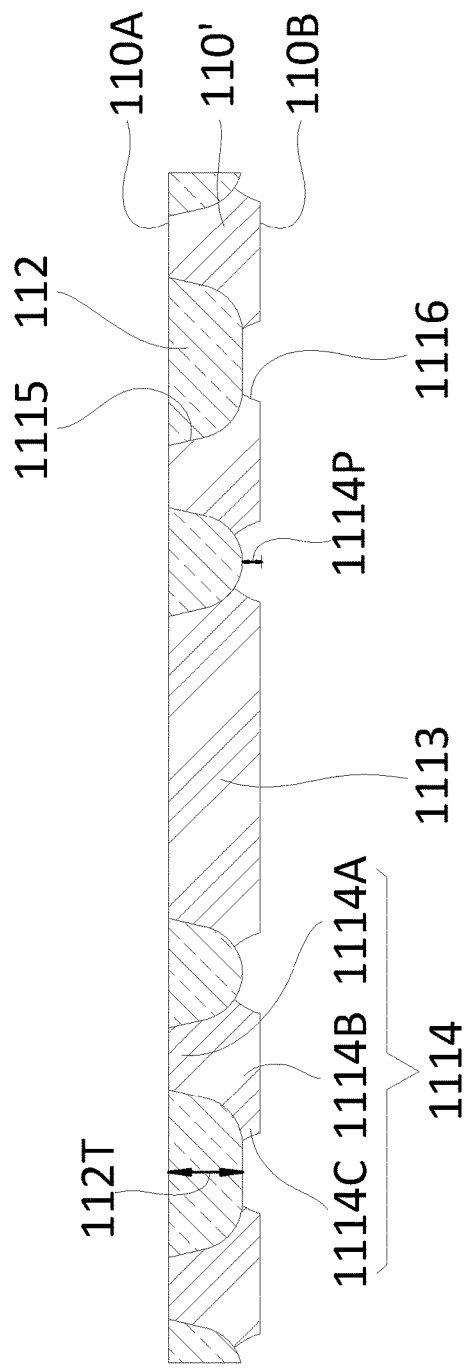

FIG. 2E shows a cross-sectional view of electronic device 100 at a later stage of manufacture. In the example shown in FIG. 2E, concave portions 1116 can be formed by partial-etching second side 110B of raw substrate 110'. Concave portions 1116 can be formed as grooves each having a predetermined depth inwardly recessed from second side 110B of raw substrate 110'. In some examples, the depth of each concave portion 1116 can range from about 25 μm to about 75 μm. In some examples, the depth of concave portion 1116 can be about 25% or less of the depth of raw substrate 110'. In some examples, the depth of concave portion 1116 formed in second side 1106 of raw substrate 110' can be smaller than that of concave portion 1115 formed in first side 110A of raw substrate 110'. In some examples, concave portion 1116 can be formed by a dry etching process such as plasma etching, reactive ion etching (RIE) or sputter etching, or a wet etching process such as immersion or spraying.

In some examples or locations, concave portions 1116 can be located to correspond to concave portions 1115 formed in first side 110A of raw substrate 110'. Concave portions 1116 can expose substrate encapsulant 112 filling concave portion 1115 to second side 1106 of raw substrate 110'. In some examples, widths of concave portions 1116 can be different from those of concave portions 1115. Concave portions 1116 can form lateral sides of paddle 1113 or lead 1114. The lateral sides of paddle 1113 or lead 1114 can be formed by concave portions 1115 and 1116, and substrate encapsulant 112 can be positioned between paddle 1113 and lead 1114. In some examples, concave portions 1116 define protrusion lateral sides of lead protrusion 1114B or protrusion lateral sides of lead protrusion 1114B and lead trace 1114C.

Paddle 1113 can be a portion of raw substrate 110' and can be separated from lead 1114 by concave portions 1115 or 1116. Paddle 1113 can be made of similar material, for example, copper, as raw substrate 110'. In some examples, paddle 1113 can be positioned at the center of raw substrate 110'. Paddle 1113 can have a smaller width than lead 1114. In some examples, electronic component 120 can be mounted on paddle 1113. In some examples, paddle 1113 can provide a space where electronic component 120 is to be mounted. In some examples, paddle 1113 can be optional. In some examples, paddle 1113 can comprise or be referred as a lead, or can be another lead 1114.

Lead 1114 can be part of raw substrate 110' and can be separated from paddle 1113 by concave portions 1115 or 1116. Lead 1114 can be made of similar material, e.g., copper, as raw substrate 110'. Lead 1114 can be provided as an electrical path extending from second side 110A to first side 1106 of raw substrate 110'. Lead 1114 can be narrower than paddle 1113. In some examples, component interconnect 122 can be coupled to lead 1114. Multiple leads 1114 can be located at opposite sides of, or around a periphery of, paddle 1113. Lead 1114 can comprise lead via 1114A, lead protrusion 1114B and lead trace 1114C.

Lead via 1114A can extend from first side 110A toward second side 1106 of raw substrate 110'. In some examples, lead via 1114A can comprise or be referred to as a vertical path. Lateral sides of lead via 1114A can be defined by concave portions 1115. In some examples, lead via 1114A can provide an electrical path between electronic component 120 and an external component.

Lead protrusion 1114B can protrude from one end of lead via 1114A adjacent second side 1106 of raw substrate 110'. Lead protrusion 1114B can be protruded at second side 1106 of raw substrate 110'. Lead protrusion 1114B can protrude from substrate encapsulant 112. In some examples, lead protrusion 1114B can comprise lead protrusion thickness 1114P protruding from about 20 µm to about 70 µm past substrate encapsulant 112. Lateral sides of lead protrusion 1114B can be defined by concave portions 1116. Lead protrusion 1114b can be protruded at second side 1106 of substrate 110 to improve a coupling force with respect to an external component.

Lead trace 1114C can extend laterally from lead protrusion 1114B over substrate encapsulant 112. In some examples, lead trace 1114C can comprise or referred to as a lateral path. Lead trace 1114C can be defined as extending laterally, from lead protrusion 1114B, over sections of encapsulant 112 that have full thickness 112T. In some examples, lead trace 1114C can be protruded at second side 1106 of raw substrate 110'. Lead trace 1114C can protrude from substrate encapsulant 112. Lead trace 1114C can route an electrical signal passing through lead via 1114A and lead protrusion 1114B to lateral sides over substrate encapsulant 112. In some examples, lead trace 1114C can form a fan-in path or a fan-out path by laterally routing an electrical signal passing through lead via 1114A and lead protrusion 1114B. For example, where lead trace 1114C routes an electrical signal within a footprint of electronic component 120, a fan-in path can be formed. As another example, where lead trace 1114C routes an electrical signal along a path extending within and outside of the footprint of electronic component 120, a fan-out path can be formed.

Figure 2F:
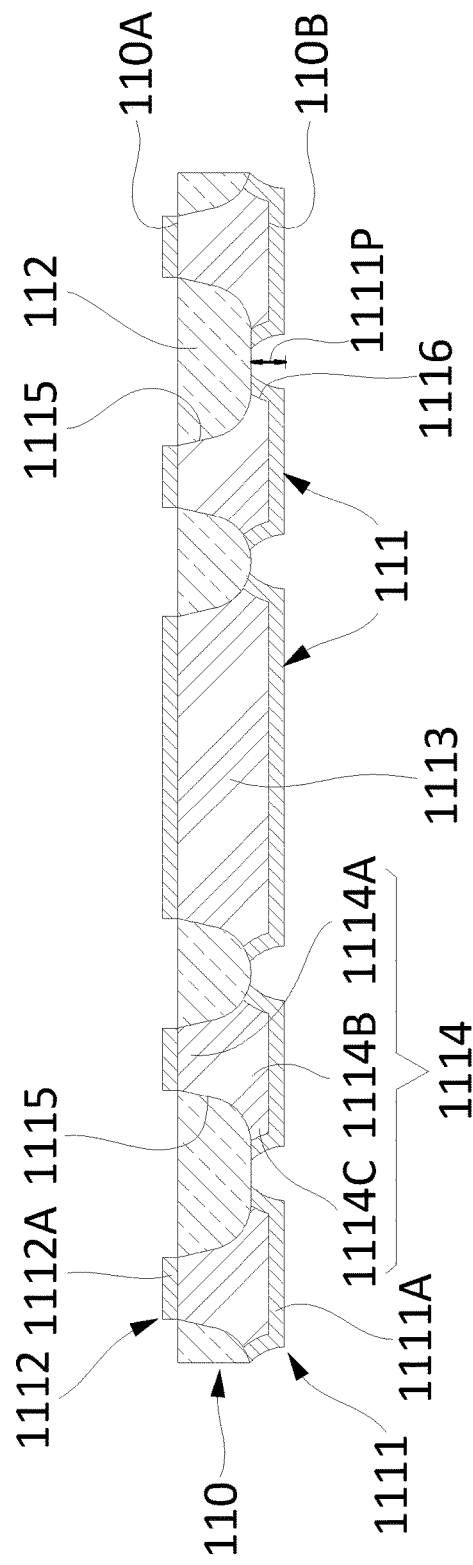

FIG. 2F shows a cross-sectional view of electronic device 100 at a later stage of manufacture. In the example shown in FIG. 2F, terminal platings 1111A and 1112A can be formed on second side 1106 and first side 110A of raw substrate 110'. Accordingly, external terminals 1111 and internal terminals 1112 can be finalized to complete substrate 110. In some examples, terminal platings 1111A and 1112A can be formed on portions of paddle 1113 or lead 1114 exposed by substrate encapsulant 112.

Terminal plating 1111A can be formed on paddle 1113 or lead 1114 exposed at second side 1106 of substrate 110. In some examples, terminal plating 1111A can also be formed on concave portions 1116 forming lateral sides of paddle 1113 or lead 1114. In some examples, the thickness of terminal plating 1111A can range from about 0.25 µm to about 15 µm. In some examples, external terminal 1111 can comprise a terminal thickness 1111P protruding from about 20 µm to about 85 µm past substrate encapsulant 112. Terminal plating 1111A can be formed by, for example, electroless plating or electroplating. Terminal plating 1111A can comprise an electrically conductive material, such as gold, silver, platinum, tin, nickel, palladium, aluminum, titanium, tungsten, or alloys of such. In some examples, terminal plating 1111A can prevent exposed portions of paddle 1113 and lead 1114 from being oxidized.

External terminal 1111 can comprise terminal plating 1111A and a portion of lead 1114 exposed from substrate encapsulant 112. External terminal 1111 can comprise or be referred to as one or more protruded pads, lands, traces, or platings. In some examples, an external interconnect such as a solder ball can be coupled to external terminal 1111.

Terminal plating 1112A can be formed on paddle 1113 or lead 1114 exposed at first side 110A of substrate 110. In some examples, the thickness of terminal plating 1112A can range from about 0.25 µm to about 15 µm. Terminal plating 1112A can be formed by, for example, electroless plating or electroplating. Terminal plating 1112A can comprise an electrically conductive material, such as gold, silver, platinum, nickel, aluminum, titanium, tungsten, or alloys or such. In some examples, terminal plating 1112A can prevent exposed portions of paddle 1113 and lead 1114 from being oxidized.

Internal terminal 1112 can comprise terminal plating 1112A and a portion of lead 1114 exposed from substrate encapsulant 112. Internal terminal 1112 can comprise or be referred to as one or more pads, lands, traces, or platings. In some examples, component interconnect 122 of electronic component 120 can be coupled to internal terminal 1112.

External terminal 1111, internal terminal 1112, paddle 1113, lead 1114, and concave portions 1115 and 1116 can be referred to as conductive structure 111. Conductive structure 111 can transfer a signal, current or voltage within substrate 110. Substrate 110 comprising conductive structure 111 and substrate encapsulant 112 can be completed using the method shown in FIGS. 2A to 2F. In some examples, a substrate 110 can comprise or be referred to as a molded substrate, a molded leadframe substrate, encapsulated leadframe substrate, or a routable leadframe substrate.

Figure 2G:
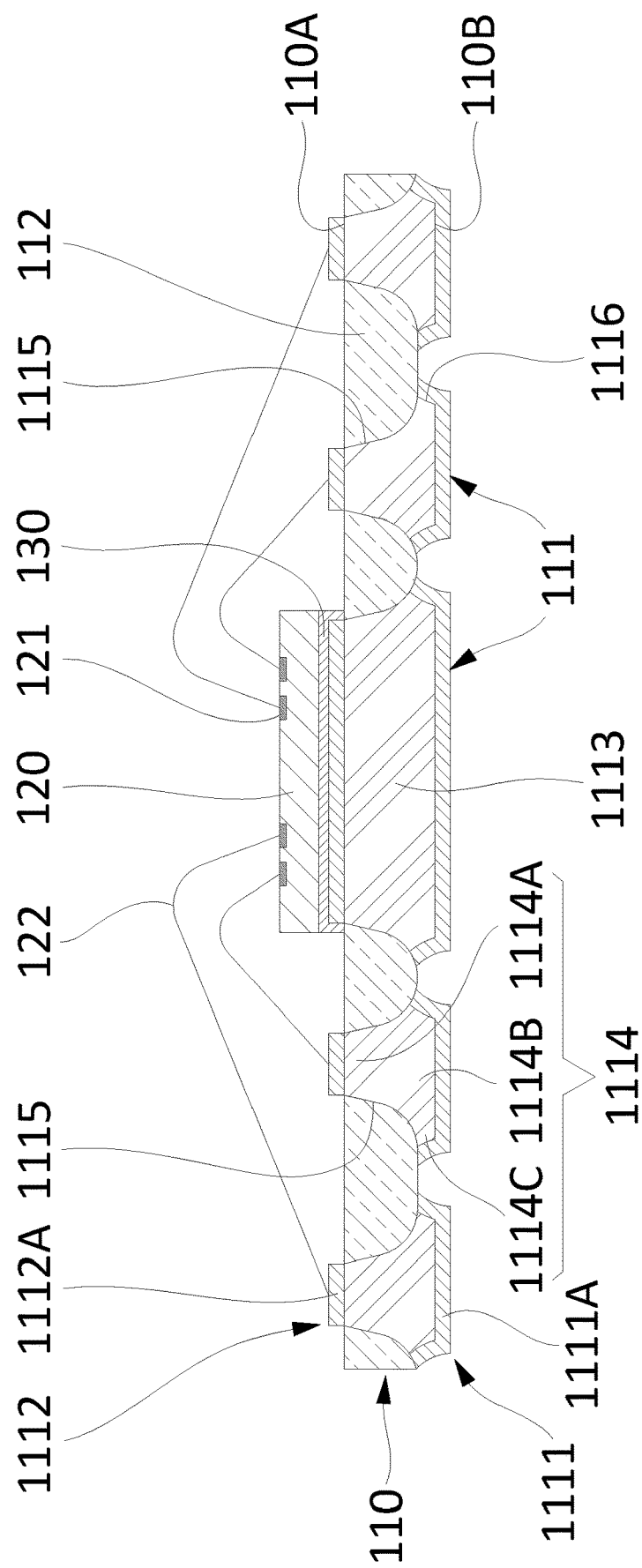

FIG. 2G shows a cross-sectional view of electronic device 100 at a later stage of manufacture. In the example shown in FIG. 2G, electronic component 120 can be attached at first side 110A of substrate 110. Electronic component 120 can be coupled with paddle 1113 using interface material 130. In some examples, electronic component 120 can be positioned within a footprint of paddle 1113. In some examples, electronic component 120 can be wider than paddle 1113. Electronic component 120 can comprise a component first side having component terminal 121, and a component second side opposite to the component first side. Electronic component 120 can comprise lateral component sides extending between the first component side and the second component side to define a footprint of electronic component 120. In some examples, electronic component 120 can be coupled with paddle 1113 in a "face-up" configuration so the component first side having component terminal 121 is positioned facing away from substrate 110. In such examples, the component second side of electronic component 120 can be positioned to face towards substrate 110.

Electronic component 120 can comprise or be referred to as one or more die, chip or package. In some examples, electronic component 120 can comprise a semiconductor package such as a chip scale package, an encapsulated package, or a wafer-level fan-out package. In the present example, electronic component 120 is presented in a wire-bonded configuration. Electronic component 120 can comprise, for example, a semiconductor material such as silicon (Si). Electronic component 120 can comprise one or more passive device, or one or more active device such as transistor. Electronic component 120 can comprise, for example, an electrical circuit, such as a memory, a digital signal processor (DSP), a microprocessor, a network processor, a power management processor, an audio processor, an RF circuit, a wireless baseband system-on-chip (SoC) processor, a sensor, or an application specific integrated circuit (ASIC). In some examples, a height or thickness of electronic component 120 can range from about 50 µm to about 500 µm.

Component terminal 121 can comprise or be referred to as one or more pad, bond pad, land, bump, pillar, or conductor. In some examples, component terminal 121 can comprise an electrically conductive material, such as copper (Cu), aluminum (Al), palladium (Pd), titanium (Ti), tungsten (W), nickel (Ni), gold (Au), silver (Ag), or alloys of such. Component terminal 121 can provide an electrical contact between electronic component 120 and substrate 110. Component interconnect 122 can be coupled to component terminal 121.

Interface material 130 can be optionally located between substrate 110 and electronic component 120. In some examples, interface material 130 can be located between terminal plating 1112A and electronic component 120 over 1113. In some examples, interface material 130 can extend over an upper portion of substrate encapsulant 112 positioned outside the footprint of paddle 1113. Interface material 130 can comprise or be referred to as a dielectric adhesive, a thermal interface material, an adhesive film, or an adhesive tape. In some examples, interface material 130 can comprise a conductive adhesive such as solder or solder paste. In some examples, interface material 130 can comprise a thermocurable adhesive, a photocurable adhesive, or a non-curable adhesive (e.g., a rubber-based adhesive, an acryl-based adhesive, a vinyl alkyl ether-based adhesive, a silicone-based adhesive, a polyester-based adhesive, a polyamide-based adhesive, or a urethane-based adhesive). Interface material 130 may secure electronic component 120 to paddle 1113. In some examples, interface material 130 can be coated on paddle 1113, and electronic component 120 can then be mounted, followed by curing interface material 130, to secure electronic component 120 onto paddle 1113. In some examples, interface material 130 can effectively transfer the heat generated from electronic component 120 to paddle 1113 to release or dissipate the heat through substrate 110. In some examples, the thickness of interface material 130 can range from about 5 µm to about 50 µm.

In the example shown in FIG. 2G, component interconnect 122 can couple electronic component 120 to substrate 110. Component interconnect 122 can comprise or be referred to as one or more wires or conductive wires. Component interconnect 122 can be an external interconnect such as a solder ball component terminal 121 to lead 1114. In some examples, one end component interconnect 122 can be coupled to component terminal 121, and the other end can be coupled to internal terminal 1112. Component interconnect 122 can comprise an electrically conductive material, such as gold, silver, platinum, tin, nickel, aluminum, titanium, tungsten, or alloys of such. In some examples where electronic component 120 is in a face-down configuration, component interconnect 122 can comprise or be referred as a bump, ball, or pillar structure.

Figure 2H:
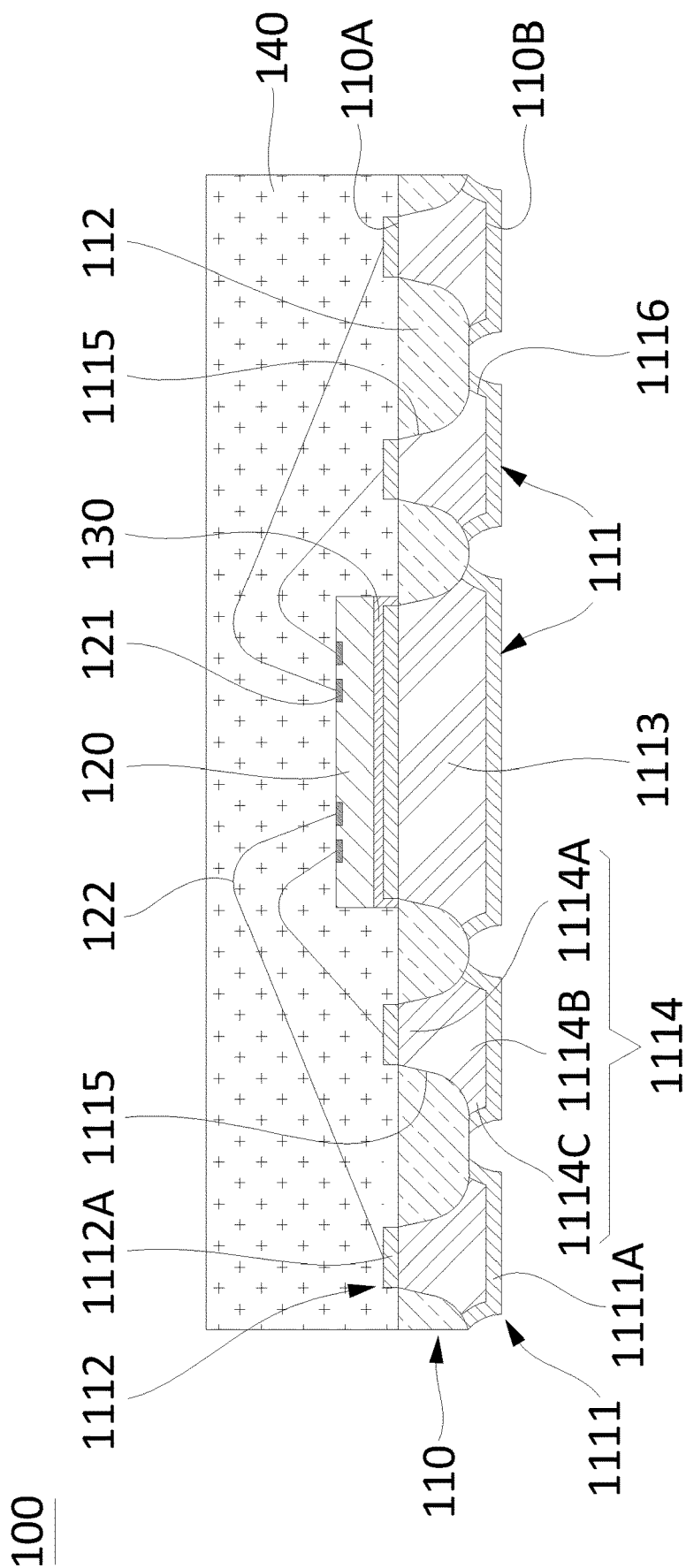

FIG. 2H shows a cross-sectional view of electronic device 100 at a later stage of manufacture. In the example shown in FIG. 2H, body encapsulant 140 can encapsulate electronic component 120 and substrate 110. In some examples, body encapsulant 140 can encapsulate electronic component 120 and component interconnect 122, positioned on first side 110A of substrate 110. In some examples, body encapsulant 140 can encapsulate the component first side and component lateral sides of electronic component 120. As shown in FIG. 2H, electronic device 100 including substrate 110, electronic component 120, interface material 130, and body encapsulant 140, can be completed. In some examples, an external interconnect such as a solder ball also can be coupled to external terminal 1111.

Body encapsulant 140 can comprise or be referred to as a mold material, a protection material, a mold compound or a resin. In some examples, body encapsulant 140 can comprise a fiber-free encapsulant, an organic resin, or an epoxy with an inorganic filler reinforcement material. Body encapsulant 140 can be formed by a variety of processes including, for example, a compression molding process, a vacuum lamination process, a liquid phase encapsulant molding process, a paste printing process, or a film assisted molding process. In some examples, the thickness of body encapsulant 140 can range from about 100 µm to about 1000 µm. Body encapsulant 140 can provide protection for electronic component 120 and component interconnect 122 from external elements or environmental exposure.

Figure 3:
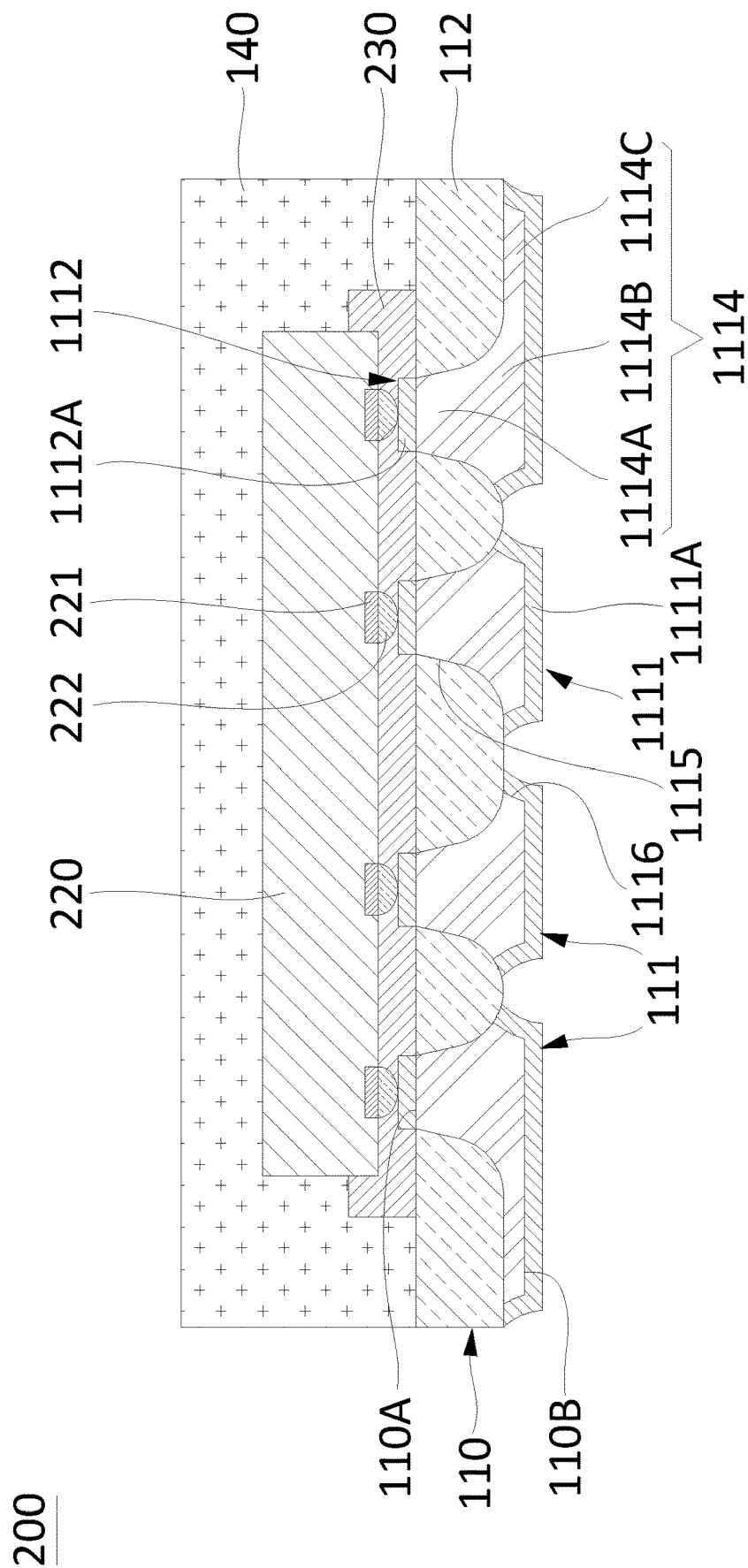
FIG. 3 shows a cross-sectional view of an example electronic device.

FIG. 3 shows a cross-sectional view of an example electronic device 200. In the example shown in FIG. 3, electronic device 200 can comprise substrate 110, electronic component 220, interface material 230, and body encapsulant 140.

In some examples, electronic device 200 can comprise corresponding elements, features, materials, or formation processes similar to those of other electronic devices described in this disclosure, such as electronic device 100.

Substrate 110 can comprise conductive structure 111 having external terminal 1111, internal terminal 1112, lead 1114, and concave portions 1115 and 1116. Electronic component 220 can comprise component terminal 221 and component interconnect 222.

Substrate 110, interface material 230 and body encapsulant 140 can be referred to as a semiconductor package or a package, and it can provide protection for electronic component 220 from external elements or environmental exposure. The semiconductor package can provide an electrical coupling between an external component and electronic component 220.

Figure 4E:
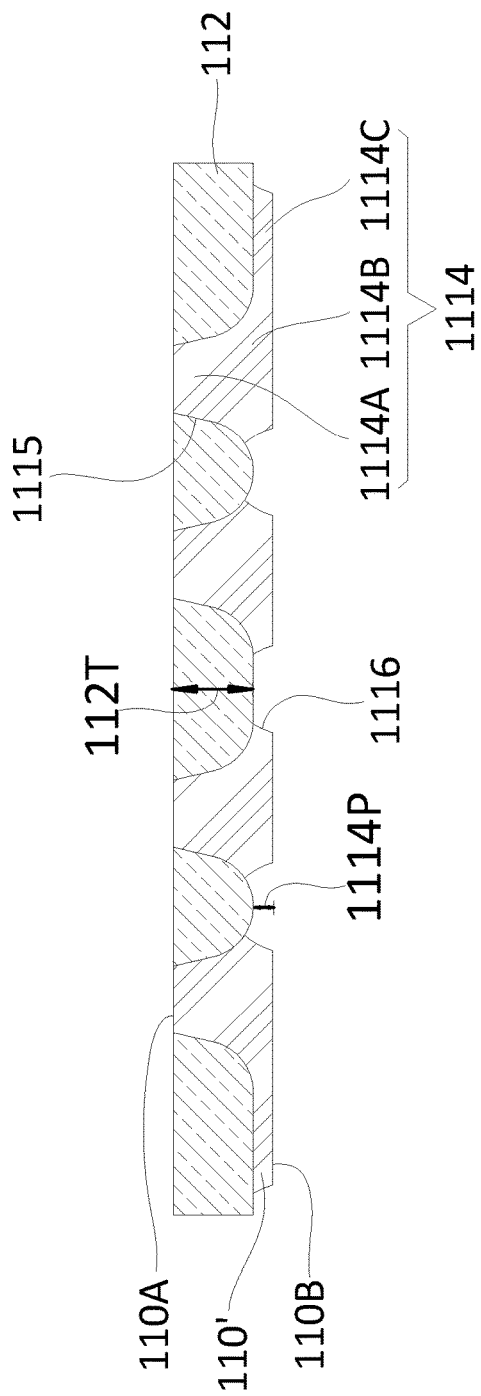

FIGS. 4A to 4I show cross-sectional views of an example method for manufacturing an example electronic device. FIG. 4A shows a cross-sectional view of electronic device 200 at an early stage of manufacture.

In the example shown in FIG. 4A, raw substrate 110' having first side 110A and second side 110B where it is opposite to first side 110A, can be prepared.

FIG. 4B shows a cross-sectional view of electronic device 200 at a later stage of manufacture. In the example shown in FIG. 4B, concave portions 1115 can be formed by partial-etching first side 110A of raw substrate 110'. Concave portions 1115 can be spaced apart from each other or can be formed to have different widths. Concave portions 1115 can define portions of lateral sides of leads 1114.

FIG. 4C shows a cross-sectional view of electronic device 200 at a later stage of manufacture. In the example shown in FIG. 4C, substrate encapsulant 112 can encapsulate first side 110A of raw substrate 110'. In some examples, substrate encapsulant 112 can be formed to cover first side 110A of raw substrate 110' while filling up concave portions 1115.

FIG. 4D shows a cross-sectional view of electronic device 200 at a later stage of manufacture. In the example shown in FIG. 4D, first side 110A of raw substrate 110' can be exposed by removing a portion of substrate encapsulant 112. Substrate encapsulant 112 can electrically insulate neighboring leads 1114 from each other.

FIG. 4E shows a cross-sectional view of electronic device 200 at a later stage of manufacture. In the example shown in FIG. 4E, concave portions 1116 can be formed by partial-etching second side 1106 of raw substrate 110'. Concave portions 1116 can be formed as grooves each having a predetermined depth inwardly recessed from second side 1106 of raw substrate 110'. Concave portions 1116 can expose substrate encapsulant 112 filling concave portions 1115 at second side 1106 of raw substrate 110'. Widths of concave portions 1116 can be different from those of concave portions 1115. Concave portions 1116 can form lateral sides of lead 1114. The lateral sides of lead 1114 can be formed by concave portions 1115 and 1116.

Lead 1114 can be part of raw substrate 110' and can be separated from another adjacent lead 1114 by concave portions 1115 and 1116. In some examples, lead 1114 can provide a space where electronic component 220 can be mounted. In some examples, component interconnect 222 can be coupled to lead 1114.

Figure 4F:
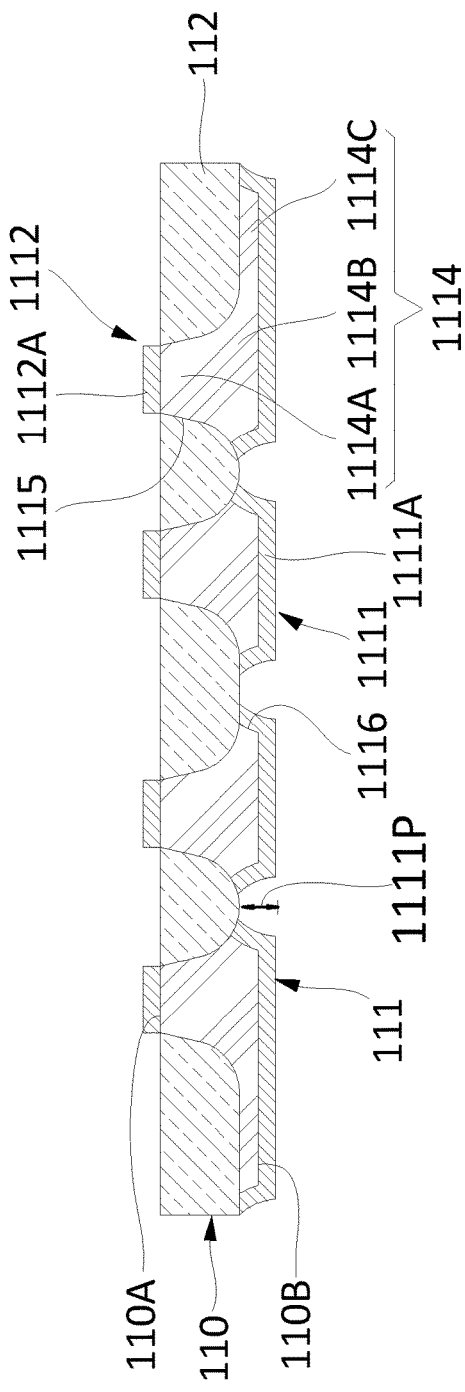

FIG. 4F shows a cross-sectional view of electronic device 200 at a later stage of manufacture. In the example shown in FIG. 4F, terminal platings 1111A and 1112A can be formed on second side 1106 and first side 110A of raw substrate 110', respectively, to finalize external terminal 1111 and internal terminal 1112 and to complete substrate 110. In some examples, terminal platings 1111A and 1112A can be formed on opposite sides of lead 1114 exposed by substrate encapsulant 112.

Terminal plating 1111A can be formed on lead 1114 exposed to second side 1106 of substrate 110. In some examples, terminal plating 1111A can also be formed on concave portion 1116 defining lateral sides of lead 1114. External terminal 1111 can comprise terminal plating 1111A and a portion of lead 1114 exposed from substrate encapsulant 112.

Terminal plating 1112A can also be formed on lead 1114 exposed at first side 110A of substrate 110. Internal terminal 1112 can comprise terminal plating 1112A and a portion of lead 1114 exposed from substrate encapsulant 112.

External terminal 1111, internal terminal 1112, lead 1114, and concave portions 1115 and 1116 can be referred to as conductive structure 111. Conductive structure 111 can transfer a signal, current or voltage within substrate 110. Substrate 110 comprising conductive structure 111 and substrate encapsulant 112 can be completed using the method shown in FIGS. 4A to 4F. In the present example, paddle 1113 of substrate 110 shown in FIG. 2F can be omitted in substrate 110.

Figure 4G:
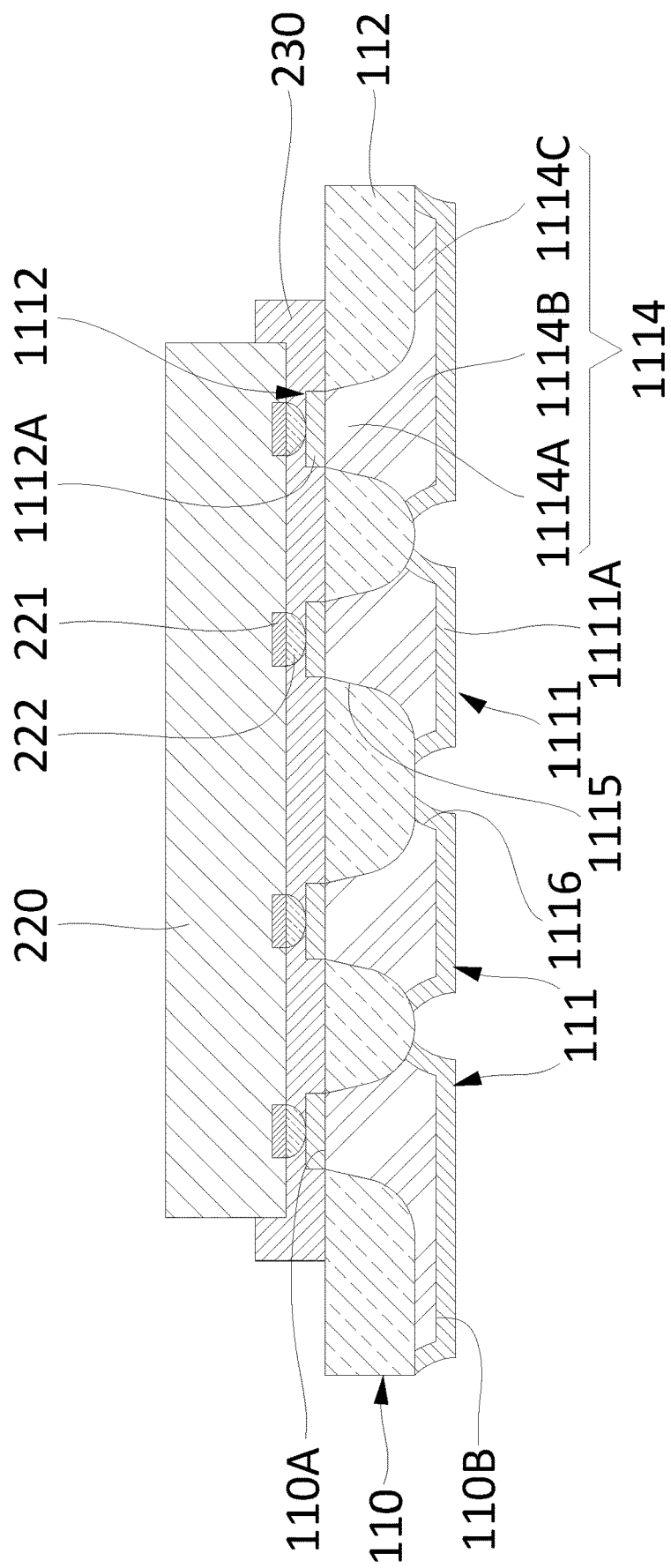

FIG. 4G shows a cross-sectional view of electronic device 200 at a later stage of manufacture. In the example shown in FIG. 4G, electronic component 220 can coupled to first side 110A of substrate 110. Electronic component 220 can be mounted over one or more leads 1114. Electronic component 220 can comprise a component first side having component terminal 221, and a component second side opposite to the component first side. Electronic component 220 can be coupled with lead 1114 in a "face-down" configuration so the component first side having component terminal 221 faces towards substrate 110 and lead 1114. Component interconnect 222 can be located at component terminal 221, and electronic component 220 can be coupled to lead 1114 through component interconnect 222.

Electronic component 220 comprise or be referred to as one or more die, chip or package. In some examples, electronic component 220 can comprise a semiconductor package such as a chip scale package, an encapsulated package, or a wafer-level fan-out package. In the present example, electronic component 220 is presented in a flip-chip configuration. In some examples, electronic component 220 can comprise corresponding elements, features, materials, or formation processes similar to those of electronic component 120 described in this disclosure.

Component terminal 221 can comprise or be referred to as one or more pads, bond pads, lands, bumps, pillars, or conductor. In some examples, component terminal 221 can comprise an electrically conductive material, such as copper (Cu), aluminum (Al), palladium (Pd), titanium (Ti), tungsten (W), nickel (Ni), gold (Au), silver (Ag), or alloys of such. Component terminal 221 can provide an electrical contact between electronic component 220 and substrate 110. Component terminal 221 can be positioned to align with or couple to internal terminal 1112.

Component interconnect 222 can couple electronic component 220 and substrate 110 to each other. Component interconnect 222 can comprise or be referred to as one or more bump, pillar, post, or solder ball. Component interconnect 222 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, component interconnect 222 can be formed by, for example, a ball drop process, a screen-printing process, an electroplating process, or a deposition process.

In some examples a thickness of component interconnect 222 can range from about 20 μm to about 100 μm. Component interconnect 222 can be coupled between component terminal 221 and internal terminal 1112. In some examples, component interconnect 222 can secure electronic component 220 to substrate 110.

In the example shown in FIG. 4G, interface material 230 can be formed between substrate 110 and electronic component 220. In some examples, interface material 230 can be positioned between first side 110A of substrate 110 and the component first side of electronic component 220. Interface material 230 can comprise or be referred to as an underfill, a thermal interface material or an adhesive. In some examples, interface material 230 can comprise an epoxy, a thermoplastic material, a thermocurable material, polyimide, polyurethane, a polymeric material, a filled epoxy, a filled thermoplastic material, a filled thermocurable material, a filled polyimide, a filled polyurethane, a filled polymeric material or a fluxed underfill. Interface material 230 can be applied to cover internal terminal 1112 or component interconnect 222. In some examples, electronic component 220 can be coupled with substrate 110, and interface material 230 can be injected or absorbed between substrate 110 and electronic component 220. In some examples, interface material 230 can transfer the heat generated from electronic component 220 to substrate 110 to then release the heat, or can fill voids between different component interconnects 222. In some examples, interface material 230 can be optional, or can comprise a portion of body encapsulant 140 applied in FIG. 4H.

Figure 4H:
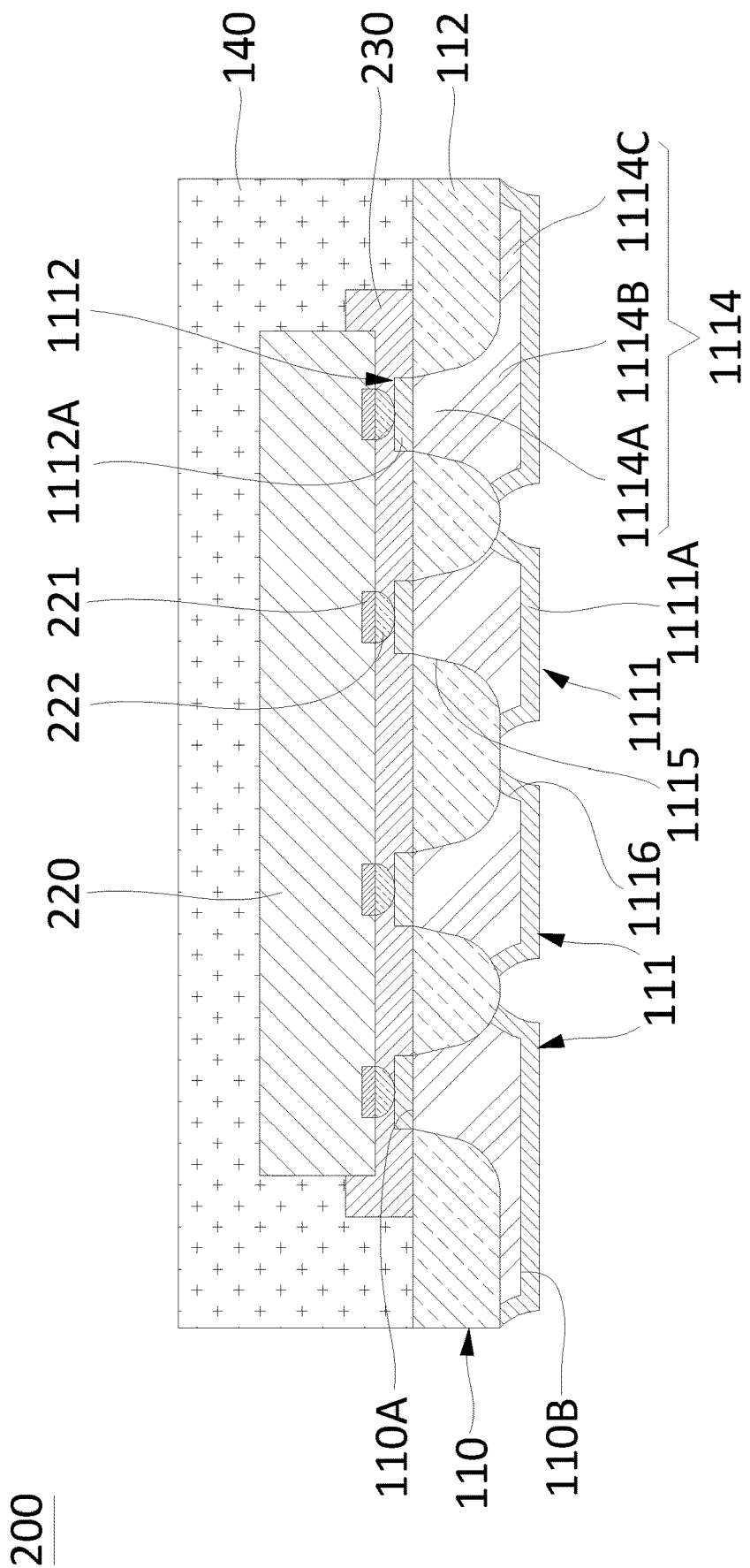

FIG. 4H shows a cross-sectional view of electronic device 200 at a later stage of manufacture. In the example shown in FIG. 4H, body encapsulant 140 can encapsulate electronic component 220 and substrate 110. In some examples, body encapsulant 140 can encapsulate electronic component 220 or component interconnects 222 positioned on first side 110A of substrate 110. In some examples, body encapsulant 140 can encapsulate the component second side and component lateral sides of electronic component 220. In the present example, body encapsulant 140 encapsulates interface material 230 applied in FIG. 4G. In some examples, interface material 230 is omitted in FIG. 4G, and is applied in FIG. 4H as a portion of the same material layer as body encapsulant 140 that extends between electronic component 220 and substrate 110 while body encapsulant 140 is applied. As shown in FIG. 4H, electronic device 200 comprising substrate 110, electronic component 220, interface material 230 and body encapsulant 140, can be completed. In some examples, an external interconnect such as a solder ball can be coupled to external terminal 1111.

Figure 5:
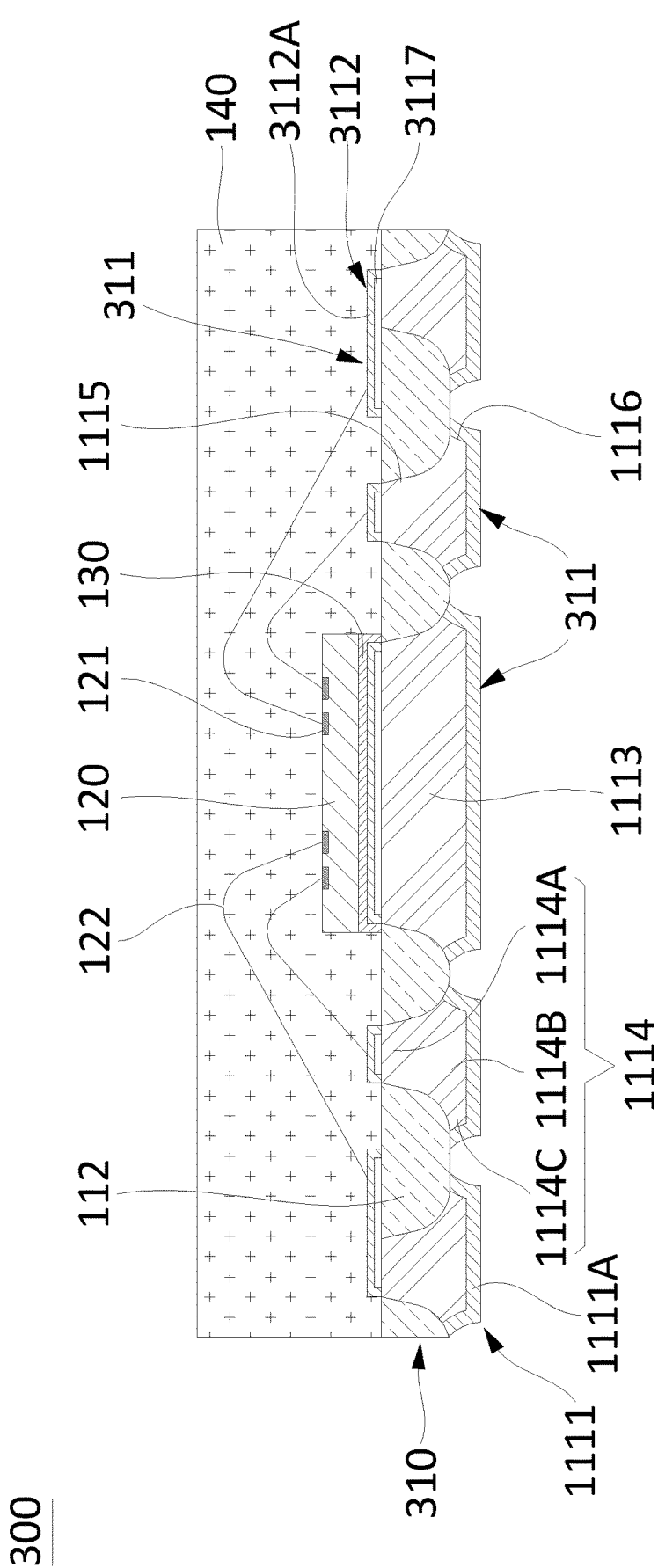
FIG. 5 shows a cross-sectional view of an example electronic device.

FIG. 5 shows a cross-sectional view of an example electronic device 300. In the example shown in FIG. 5, electronic device 300 can comprise substrate 310, electronic component 120, interface material 130, and body encapsulant 140.

In some examples, electronic device 300 can comprise corresponding elements, features, materials, or formation processes similar to those of other electronic devices described in this disclosure, such as electronic device 100 or 200.

Substrate 310 can be similar to substrate 110, and can comprise conductive structure 311 and substrate encapsulant 112. Conductive structure 311 can comprise external terminal 1111, internal terminal 3112, paddle 1113, lead 1114, concave portions 1115 and 1116, and redistribution structure 3117. Internal terminal 3112 can comprise terminal plating 3112A.

Substrate 310, interface material 130 and body encapsulant 140 can be referred to as a semiconductor package or a package, where it can provide protection for electronic component 120 from external elements or environmental exposure. The semiconductor package can provide an electrical coupling between an external component and electronic component 120.

Figure 6A:
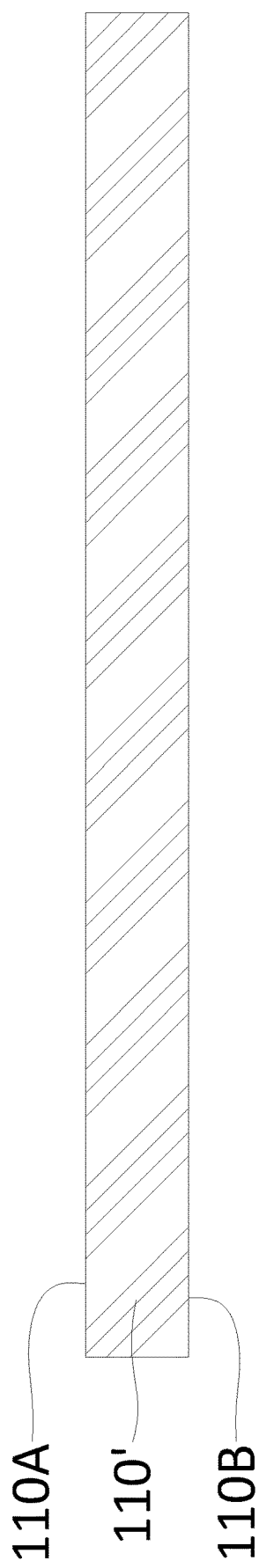
FIGS. 6A, 6B, 6C, 6D, 6E, 6F, 6G, 6H, and 6I show cross-sectional views of an example method for manufacturing an example electronic device.

FIGS. 6A to 6I show cross-sectional views of an example method for manufacturing an example electronic device. FIG. 6A shows a cross-sectional view of electronic device 300 at an early stage of manufacture.

In the example shown in FIG. 6A, raw substrate 110' having first side 110A and second side 110B where it is opposite to first side 110A, can be prepared.

Figure 6B:
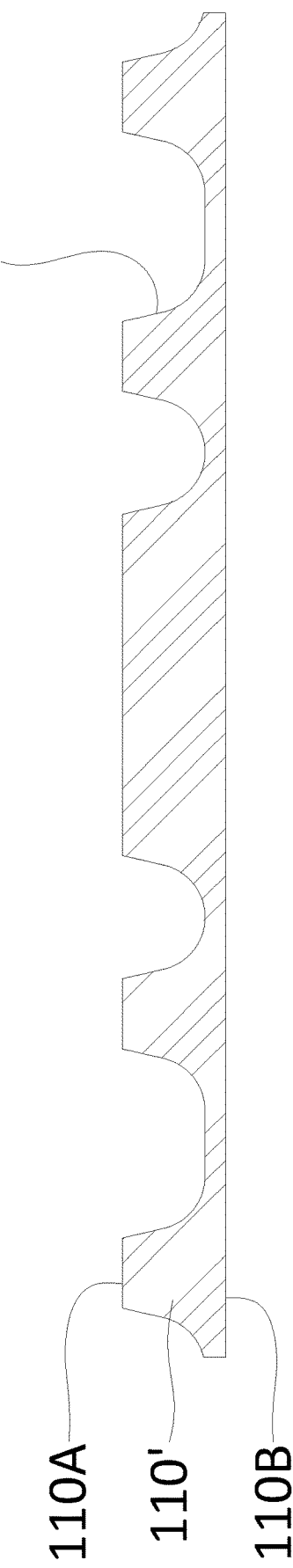

FIG. 6B shows a cross-sectional view of electronic device 300 at a later stage of manufacture. In the example shown in FIG. 6B, concave portions 1115 can be formed by partial-etching first side 110A of raw substrate 110'. Concave portions 1115 can be spaced apart from each other or can be formed to have different widths. Concave portions 1115 can define portions of lateral sides of leads 1114.

Figure 6C:
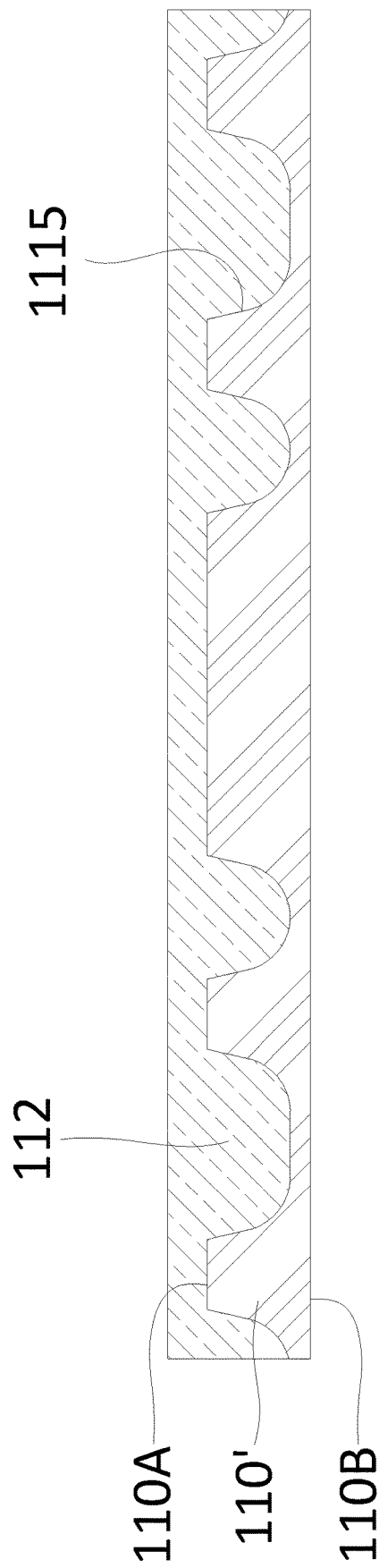

FIG. 6C shows a cross-sectional view of electronic device 300 at a later stage of manufacture. In the example shown in FIG. 6C, substrate encapsulant 112 can encapsulate first side 110A of raw substrate 110'. In some examples, substrate encapsulant 112 can be formed to cover first side 110A of raw substrate 110' while filling up concave portions 1115.

Figure 6D:
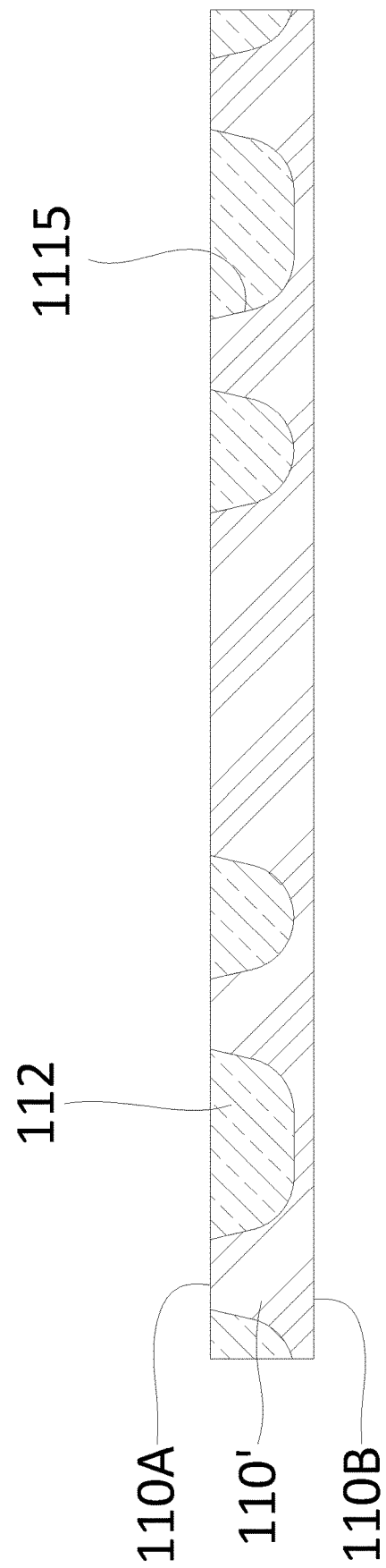

FIG. 6D shows a cross-sectional view of electronic device 300 at a later stage of manufacture. In the example shown in FIG. 6D, first side 110A of raw substrate 110' can be exposed by removing a portion of substrate encapsulant 112. Substrate encapsulant 112 can electrically insulate neighboring leads 1114 from each other.

Figure 6E:
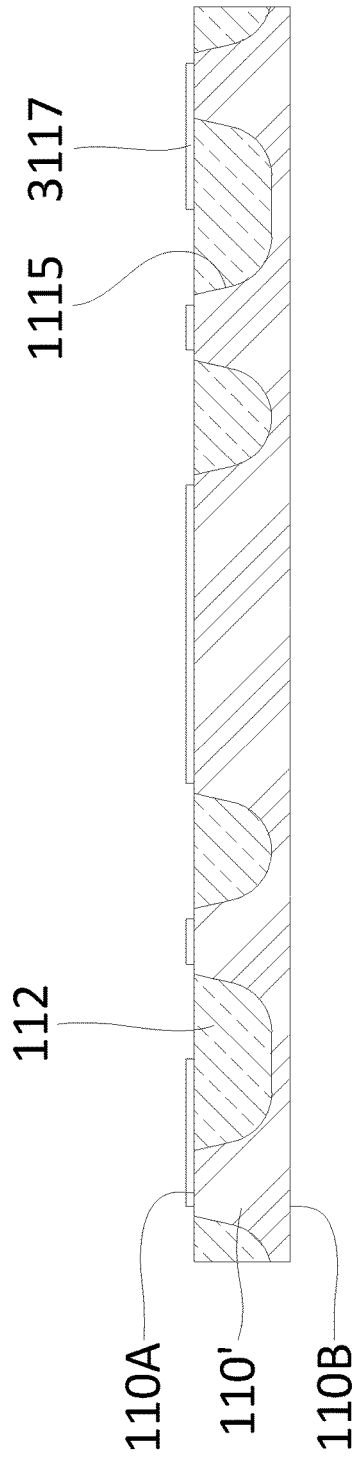

FIG. 6E shows a cross-sectional view of electronic device 300 at a later stage of manufacture. In the example shown in FIG. 6E, redistribution structure 3117 can be formed on first side 110A of raw substrate 110'. Redistribution structure 3117 can be considered part of conductive structure 311.

Redistribution structure 3117 can comprise or be referred to as one or more conductive redistribution layers (RDLs), traces, pads, lands, or vias. For example, redistribution structure 3117 can comprise an electrically conductive material, such as copper (Cu), aluminum (Al), palladium (Pd), titanium (Ti), tungsten (W), nickel (Ni), gold (Au), silver (Ag), or alloys of such. Redistribution structure 3117 can be formed by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, a seed layer can be formed on first side 110A of raw substrate 110' by sputtering, a plating layer can then be formed by plating, followed by patterning the seed layer and the plating layer by etching to define conductive paths of redistribution structure 3117. In some examples, redistribution structure 3117 can comprise a first redistribution layer over first side 110A or substrate 110', or a second redistribution layer stacked over the first redistribution layer. In some examples, redistribution structure 3117 can comprise a dielectric layer between such first redistribution layer and substrate encapsulant 112, or a dielectric layer between such stacked first and second redistribution layers.

In some examples, redistribution structure 3117 can provide conductive paths for lateral redistribution of signals, voltages, or currents over substrate encapsulant 112 across first side 110A of raw substrate 110'. For example, where a trace of redistribution structure 3117 routes an electrical signal within a footprint of electronic component 120, a fan-in path can be formed. As another example, where a trace of redistribution structure 3117 routes an electrical signal along a path extending within and outside of the footprint of electronic component 120, a fan-out path can be formed.

Redistribution structure 3117 can be coupled to paddle 1113 or lead 1114 exposed at first side 110A of raw substrate 110'. In some examples, a thickness of a redistribution layer of redistribution structure 3117 can range from about 10 μm to about 60 μm.

Figure 6F:
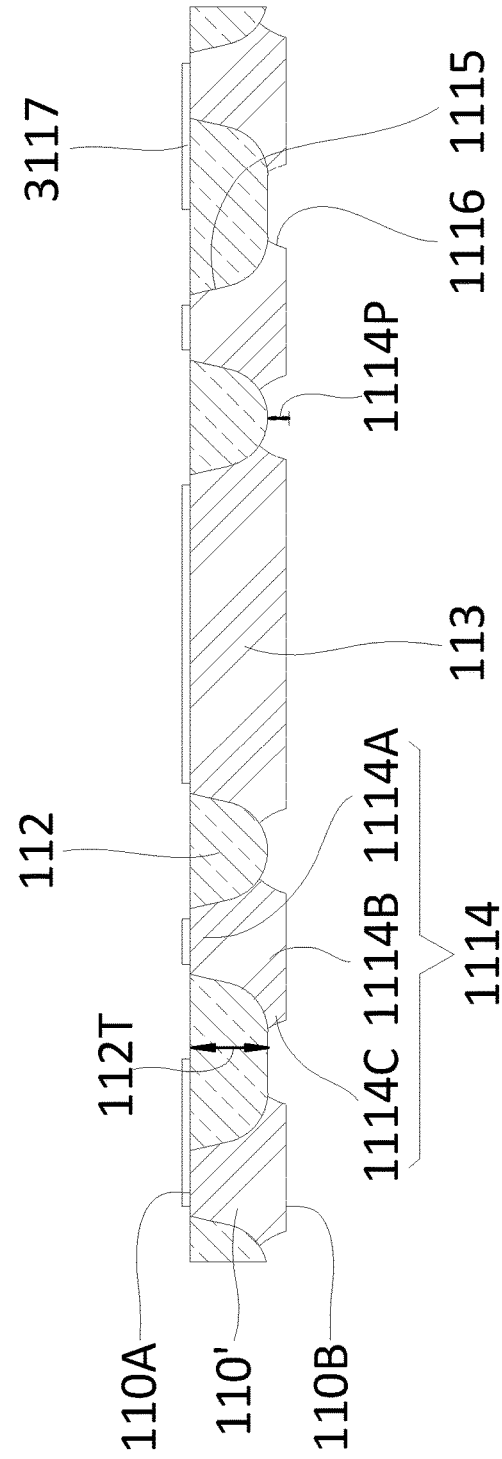

FIG. 6F shows a cross-sectional view of electronic device 300 at a later stage of manufacture. In the example shown in FIG. 6F, concave portions 1116 can be formed by partial-etching second side 1106 of raw substrate 110'. Concave portions 1116 can be located to correspond to concave portions 1115 formed on first side 110A of raw substrate 110'. Concave portions 1116 can be formed to have different widths from concave portions 1115. Concave portions 1116 can define lateral sides of lead 1114. The lateral sides of lead 1114 can be defined by concave portions 1115 and 1116.

Figure 6G:
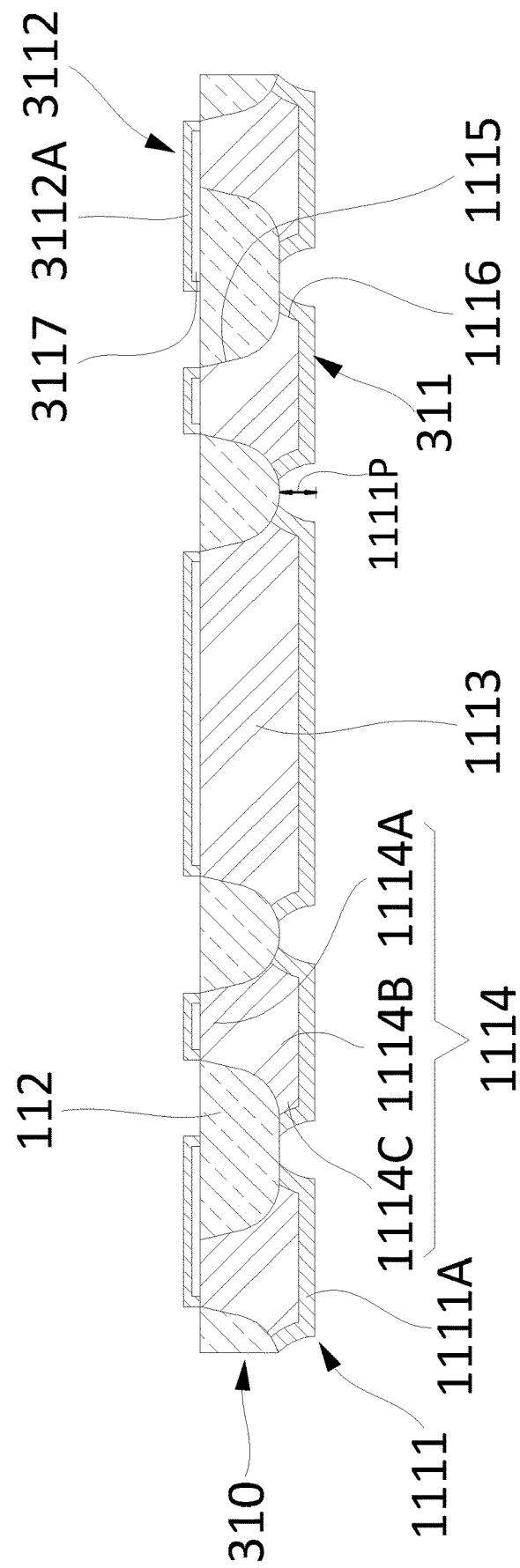

FIG. 6G shows a cross-sectional view of electronic device 300 at a later stage of manufacture. In the example shown in FIG. 6G, terminal plating 1111A can be formed on second side 1106 of raw substrate 110', and terminal plating 3112A can be formed on first side 110A of raw substrate 110'. Accordingly, external terminal 1111 and internal terminal 3112 can be formed to complete substrate 310. Terminal plating 3112A can be formed on redistribution structure 3117. In some examples, terminal plating 3112A can be considered part of redistribution structure 3117.

Terminal plating 3112A can be formed on redistribution structure 3117 positioned on first side 110A of substrate 310. Terminal plating 3112A can be formed to cover top or lateral sides of redistribution structure 3117. In some examples, terminal plating 3112A can comprise corresponding elements, features, materials, or formation processes similar to those of terminal plating 1112A described in this disclosure.

Internal terminal 3112 can comprise terminal plating 3112A and a portion of redistribution structure 3117 at first side 110A of substrate 310. In some examples, component interconnect 122 can be coupled with internal terminal 3112. In some examples, electronic component 120 can be mounted on internal terminal 3112. In some examples, internal terminal 3112 can comprise corresponding elements, features, materials, or formation processes similar to those of internal terminal 1112 described in this disclosure.

External terminal 1111, internal terminal 3112, paddle 1113, lead 1114, concave portions 1115 and 1116, and redistribution structure 3117 can be referred to as conductive structure 311. Conductive structure 311 can transfer a signal, current or voltage across or within substrate 310. Substrate 310 comprising conductive structure 311 and substrate encapsulant 112 can be completed using the method shown in FIGS. 6A to 6G. In some examples, substrate 310 can comprise or be referred to as molded substrate, a molded leadframe substrate, encapsulated leadframe substrate, or a routable leadframe substrate.

Figure 6H:
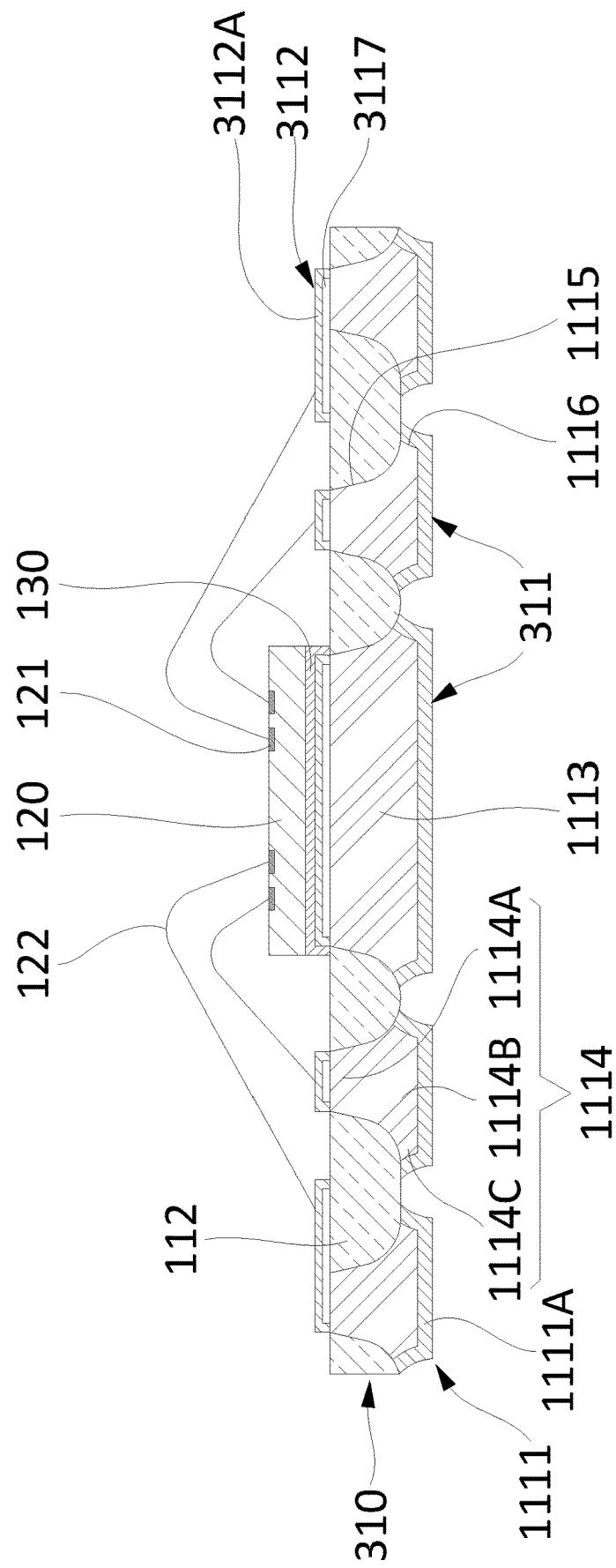

FIG. 6H shows a cross-sectional view of electronic device 300 at a later stage of manufacture. In the example shown in FIG. 6H, electronic component 120 can be coupled with first side 110A of substrate 310. Electronic component 120 can be coupled to paddle 1113 through interface material 130. Electronic component 120 can be attached onto paddle 1113 in a "face-up" configuration so the component first side having component terminal 121 is positioned facing away from substrate 310. Interface material 130 can be positioned between substrate 310 and electronic component 120. In some examples, interface material 130 can be positioned between the component second side of electronic component 120 and terminal plating 3112A over paddle 1113.

In the example shown in FIG. 6H, component interconnect 122 can couple electronic component 120 to substrate 310. Component interconnect 122 can couple component terminal 121 to lead 1114. In some examples, one end of component interconnect 122 can be coupled to component terminal 121, and the other end of component interconnect 122 can be coupled to internal terminal 3112.

Figure 6I:
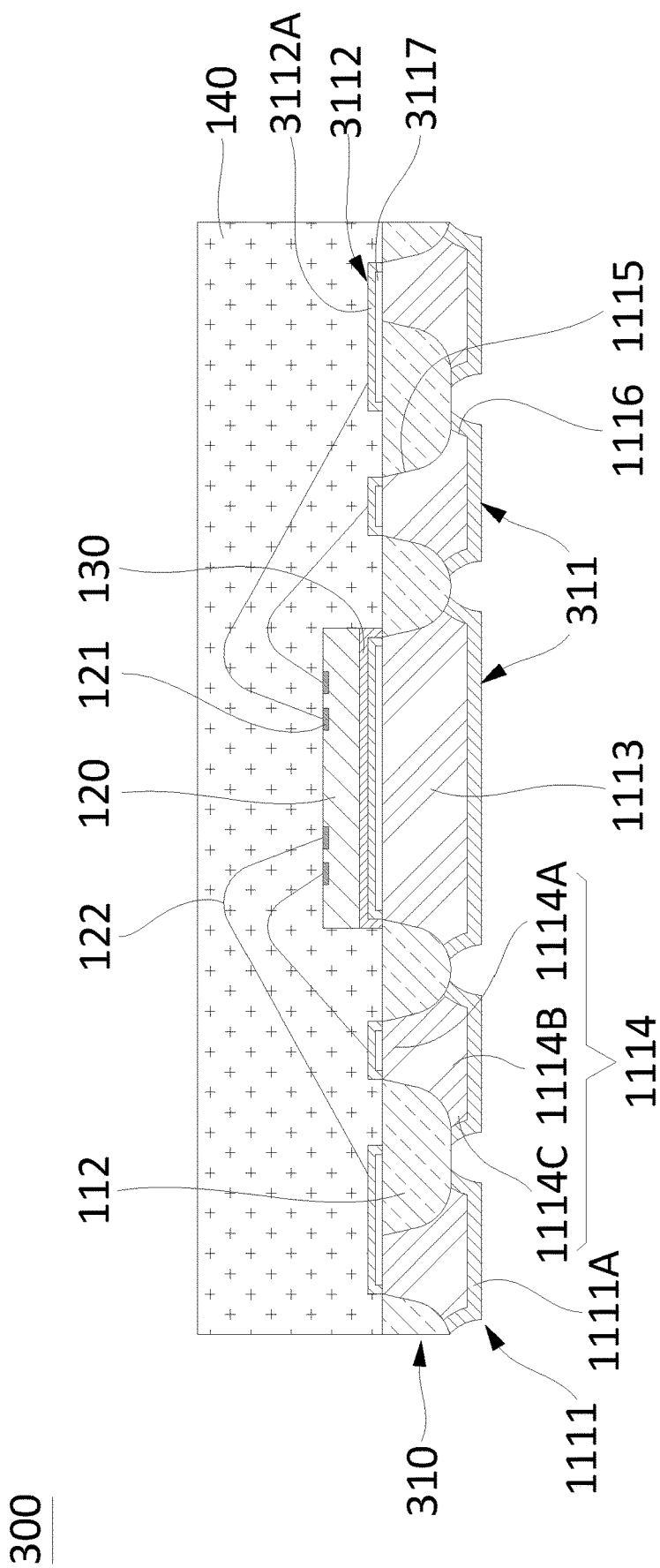

FIG. 6I shows a cross-sectional view of electronic device 300 at a later stage of manufacture. In the example shown in FIG. 6I, body encapsulant 140 can encapsulate electronic component 120 and substrate 310. In some examples, body encapsulant 140 can encapsulate electronic component 120 and component interconnect 122, positioned at first side 110A of substrate 310. As shown in FIG. 6I, electronic device 300 comprising substrate 310, electronic component 120, interface material 130, and body encapsulant 140, can be completed. In some examples, an external interconnect such as a solder ball can be coupled to external terminal 1111, thereby completing electronic device 300.

Figure 7:
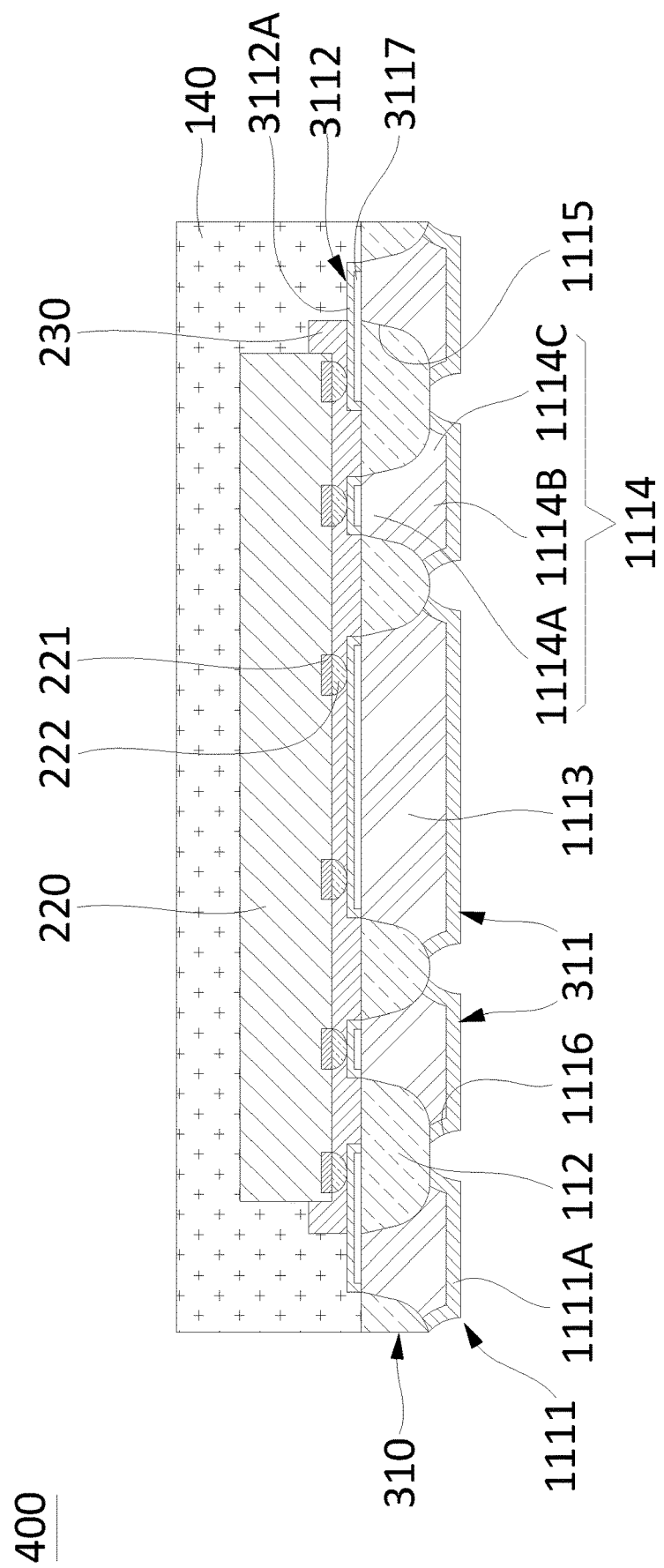
FIG. 7 shows a cross-sectional view of an example electronic device.

FIG. 7 shows a cross-sectional view of an example electronic device 400. In the example shown in FIG. 7, electronic device 400 can comprise substrate 310, electronic component 220, interface material 230, and body encapsulant 140.

In some examples, electronic device 400 can comprise corresponding elements, features, materials, or formation processes similar to those of other electronic devices described in this disclosure, such as electronic device 100, 200, or 300.

Substrate 310, interface material 230 and body encapsulant 140 can be referred to as a semiconductor package or a package, where it can provide protection for electronic component 220 from external elements or environmental exposure. The semiconductor package can provide an electrical coupling between an external component and electronic component 220.

FIGS. 8A to 8I show cross-sectional views of an example method for manufacturing an example electronic device. In the present example, the method for forming substrate 310 in FIGS. 8A-8G can be similar to that described with respect to FIGS. 6A to 6G.

Figure 8A:
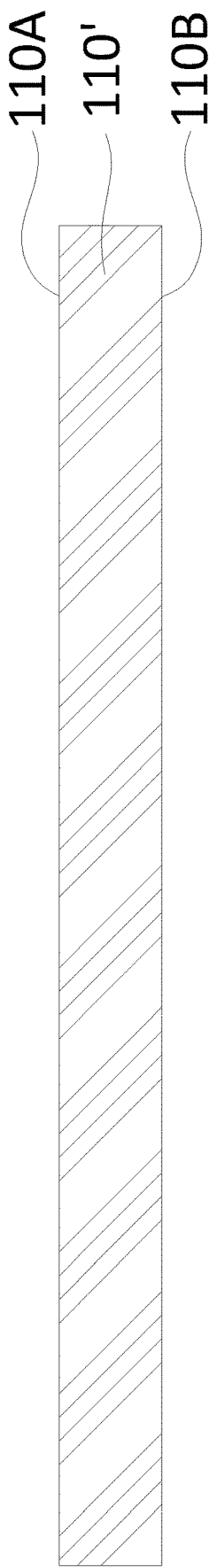
FIGS. 8A, 8B, 8C, 8D, 8E, 8F, 8G, 8H and 8I show cross-sectional views of an example method for manufacturing an example electronic device.
Figure 8B:
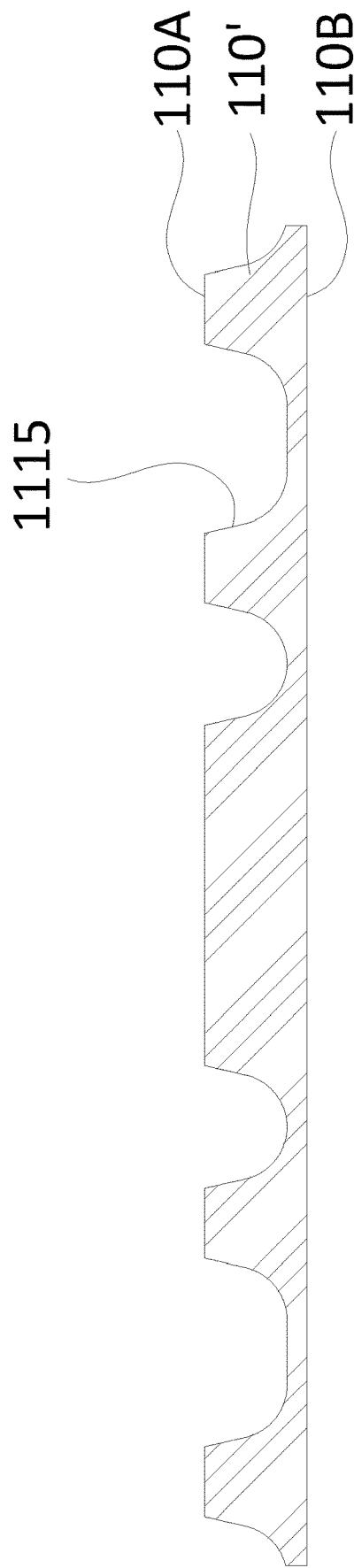
Figure 8C:
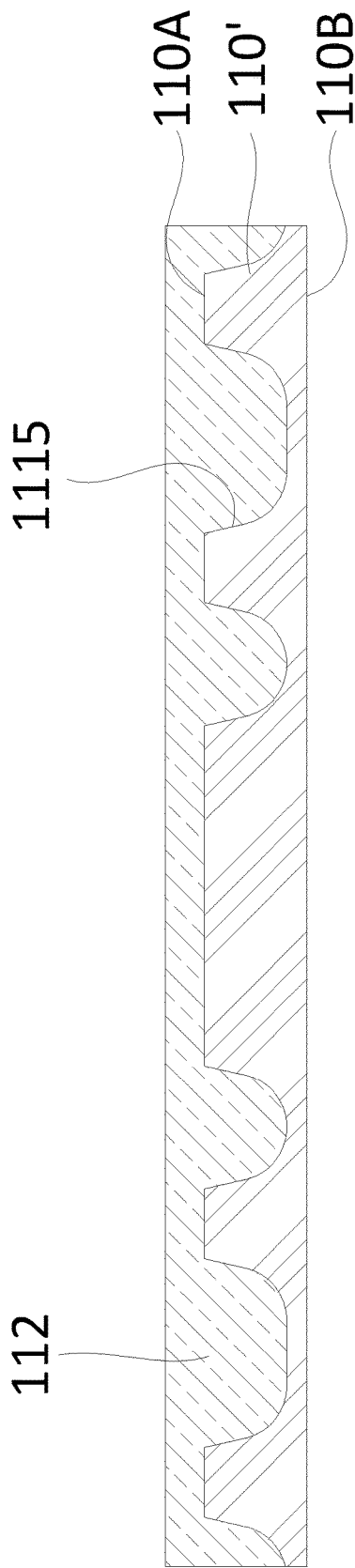
Figure 8D:
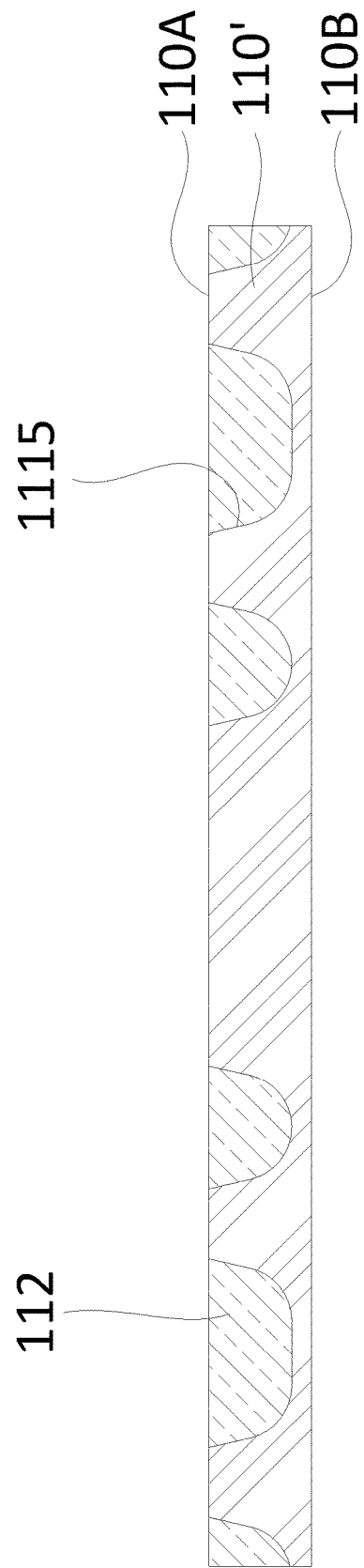
Figure 8E:
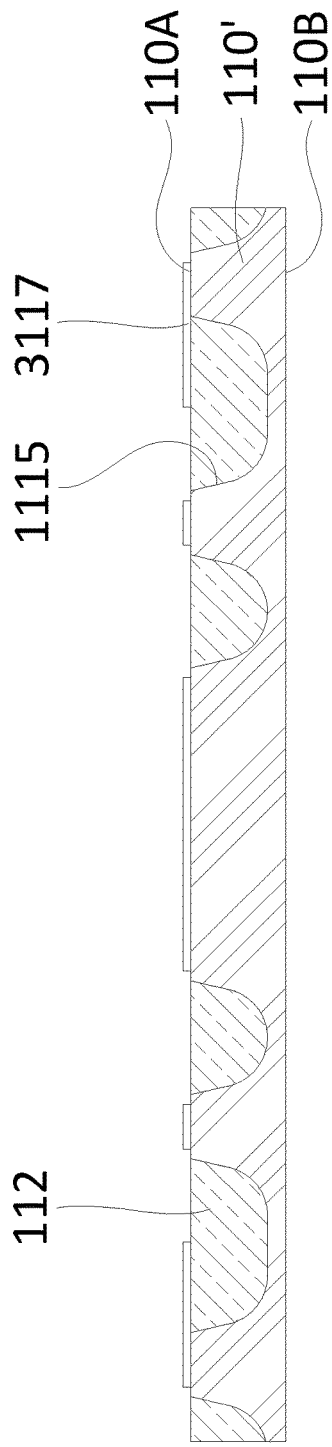
Figure 8F:
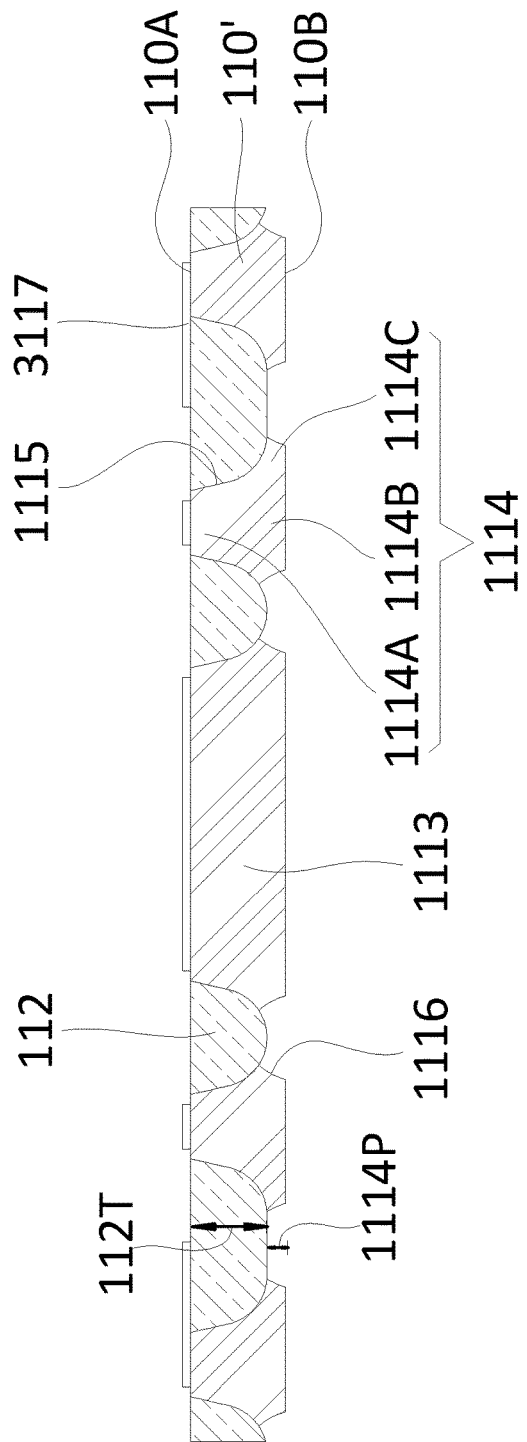
Figure 8G:
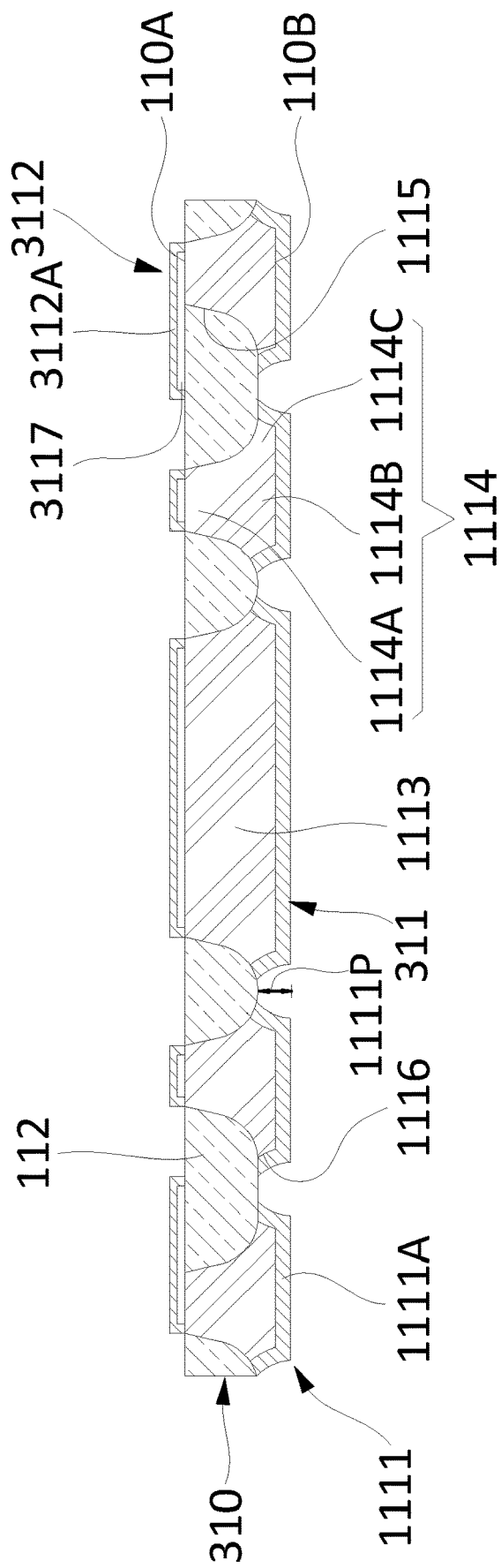
Figure 8H:
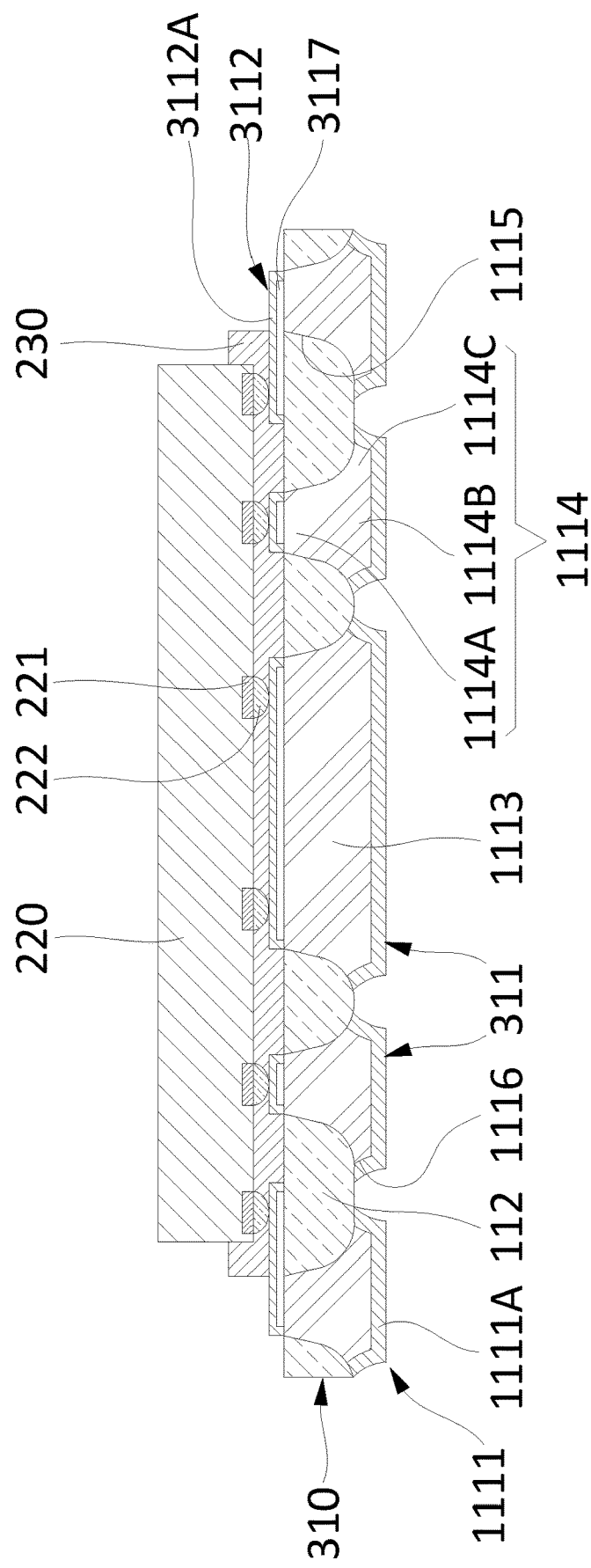

In the example shown in FIG. 8H, electronic component 220 can be coupled to first side 110A of substrate 310. Electronic component 220 can be mounted over paddle 1113 or one or more leads 1114. Electronic component 220 can comprise a component first side having component terminal 221, and a component second side opposite to the component first side. Electronic component 220 can be coupled with paddle 1113 or lead 1114 in a "face-down" configuration so the component first side having component terminal 221 faces towards substrate 310. Component interconnect 222 can be located at component terminal 221, and electronic component 220 can be coupled to paddle 1113 or lead 1114 through component interconnect 222. In some examples, component terminal 221 can be positioned to align with internal terminal 3112. Component interconnect 222 can couple electronic component 220 to substrate 310. In some examples, component interconnect 222 can comprise or be referred to as one or more bumps, pillars, posts or solder balls. Component interconnect 222 can be coupled between component terminal 221 and terminal plating 3112A.

In the example shown in FIG. 8H, interface material 230 can be optionally provided between substrate 310 and electronic component 220. In some examples, interface material 230 can be provided between first side 110A of substrate 310 and the component first side of electronic component 220. Interface material 230 can cover internal terminal 3112 or component interconnect 222.

Figure 8I:
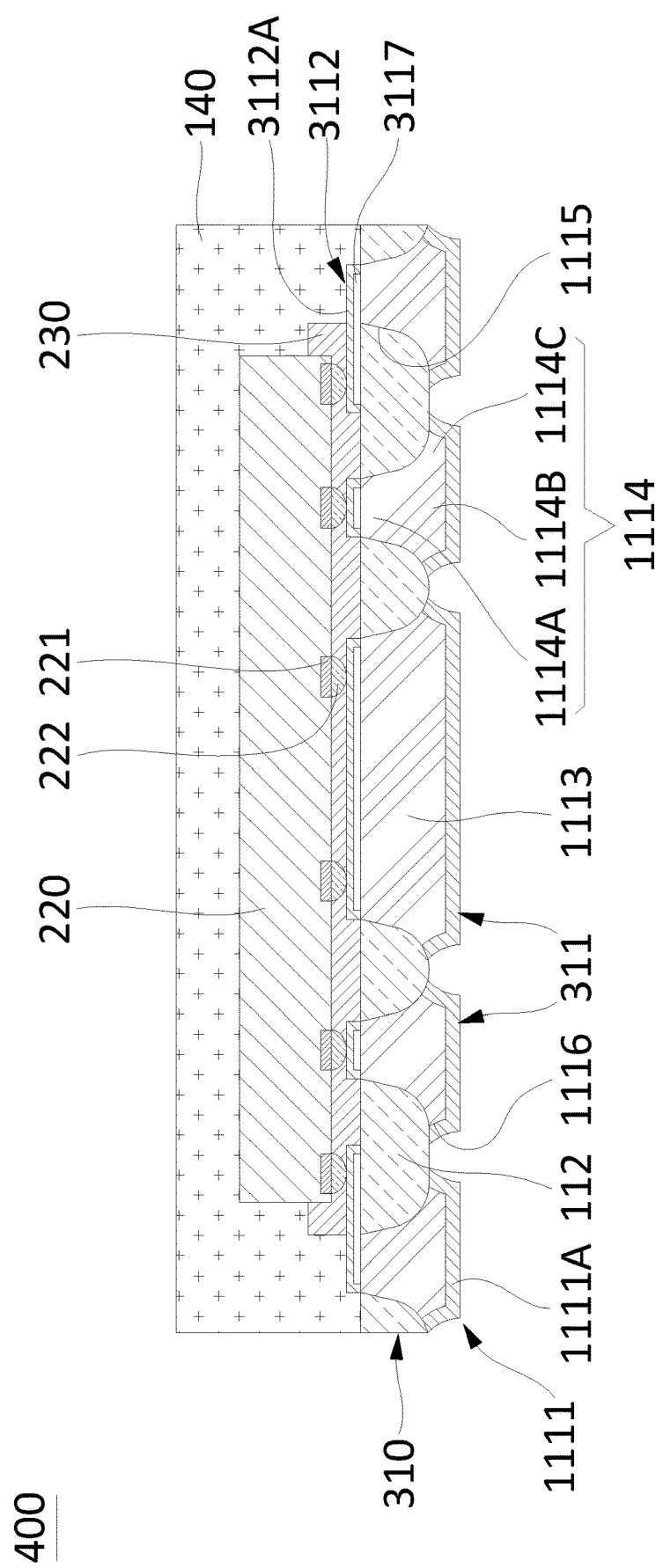

FIG. 8I shows a cross-sectional view of electronic device 400 at a later stage of manufacture. In the example shown in FIG. 8I, body encapsulant 140 can encapsulate electronic component 220 and substrate 310. In some examples, body encapsulant 140 can encapsulate electronic component 220 or component interconnects 222 positioned on first side 110A of substrate 310. In some examples, body encapsulant 140 can encapsulate the component second side and component lateral sides of electronic component 220. In the present example, body encapsulant 140 encapsulates interface material 230 applied in FIG. 8H. In some examples, interface material 230 is omitted in FIG. 8H, and is applied in FIG. 8I as a portion of the same material layer as body encapsulant 140 that extends between electronic component 220 and substrate 110 while body encapsulant 140 is applied. As shown in FIG. 8I, electronic device 400 comprising substrate 310, electronic component 220, interface material 230 and body encapsulant 140, can be completed. In some examples, an external interconnect such as a solder ball can be coupled to external terminal 1111.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device, comprising:
   a substrate comprising:
   a first side;
   a second side opposite to the first side;
   a conductive structure comprising a lead comprising a lead via, a lead protrusion, and a lead trace; and
   a substrate encapsulant, wherein:
     the lead via comprises via lateral sides and a lead via top side, wherein the via lateral sides comprise first concave shapes;
     the lead protrusion comprises a protrusion lateral side and the lead trace comprises a trace lateral side; wherein the protrusion lateral side comprises a second concave shape and the trace lateral side comprises a third concave shape;
     the substrate encapsulant covers the via lateral sides at the first side of the substrate but not the protrusion lateral side or the trace lateral side so that the lead protrusion protrudes from the substrate encapsulant at the second side of the substrate;
     the lead trace laterally extends from the lead protrusion over the substrate encapsulant at the second side of the substrate;
     the lead protrusion comprises a lead protrusion bottom side adjacent to the second side of the substrate;
     the lead trace comprises a lead trace bottom side adjacent to the second side of the substrate and substantially coplanar with the lead protrusion bottom side; and
     the trace lateral side is laterally separated from the lead via so that at least a portion of the lead trace bottom side is external to and is not overlapped by the lead via top side in a top plan view;
   a semiconductor component adjacent to the first side of the substrate and electrically coupled to the conductive structure, wherein the semiconductor component comprises:
     a first component side distal to the first side of the substrate;
     a second component side proximate to the first side of the substrate; and
     lateral component sides extending between the first component side and the second component side to define a footprint of the semiconductor component; and
   a body encapsulant encapsulating the first component side and the lateral component sides of the semiconductor component;
   wherein:
     the body encapsulant comprises a body encapsulant top side and a body encapsulant bottom side;
     the substrate encapsulant comprises a substrate encapsulant top side proximate to the first side of the substrate;
     the body encapsulant bottom side contacts the substrate encapsulant top side;
     the conductive structure further comprises:
       a first terminal layer coupled to the lead via at the first side of the substrate; and
       a second terminal layer coupled to the lead protrusion and the lead trace at the second side of the substrate;
     the protrusion lateral side comprises a first height where the protrusion lateral side adjoins the substrate encapsulant;
     the trace lateral side comprises a second height where the trace lateral side adjoins the substrate encapsulant;
     the second height is less than the first height;
     the second terminal layer comprises a conformal layer that contacts the protrusion lateral side, the trace lateral side, the lead trace bottom side, and the lead protrusion bottom side without an intervening layer;
     the first terminal layer and the lead via define an internal terminal;
     the second terminal layer, the lead protrusion, and the lead trace define an external terminal; and
     the second terminal layer is devoid of the body encapsulant; and
     the lead trace is configured to laterally route an electrical signal at the second side of the substrate in either:
       a fan-in electrical signal path where the lead trace is connected to the lead protrusion at a first location outside of the footprint and laterally extends to a second location within the footprint; or
       a fan-out electrical signal path where the lead trace is connected to the lead protrusion at a third location inside of the footprint and laterally extends to a fourth location outside of the footprint.

2. The semiconductor device of claim 1, wherein:
the semiconductor component overlies the lead via;
the semiconductor component is attached to the lead via in a flip-chip configuration;
the first terminal layer comprises a first plating;

the second terminal layer comprises a second plating; and
the external terminal comprises a protrusion thickness protruding from about 20 microns to about 70 microns past the substrate encapsulant.

3. The semiconductor device of claim 1, wherein:
the semiconductor component is devoid of physical contact to the lead trace;
the via lateral sides are separated by a first lateral width; and
the protrusion lateral side and the trace lateral side are separated by a second lateral width greater than the first lateral width.

4. The semiconductor device of claim 1, wherein:
the lead trace extends laterally over a section of the substrate encapsulant where the substrate encapsulant has a full thickness that is equal to its maximum thickness.

5. The semiconductor device of claim 1, wherein:
the lead trace comprises the fan-in electrical signal path.

6. The semiconductor device of claim 1, wherein:
the lead trace comprises the fan-out electrical signal path.

7. The semiconductor device of claim 1, wherein:
the conductive structure further comprises a paddle;
the semiconductor component is coupled to the paddle; and
the semiconductor device further comprises an interface material interposed between the semiconductor component and the first side of the substrate.

8. The semiconductor device of claim 1, wherein:
the conductive structure further comprises a redistribution structure coupled to the lead via at the first side of the substrate;
the redistribution structure laterally extends along the substrate encapsulant to overlap at least one of the via lateral sides in its entirety; and
the redistribution structure is configured to laterally route an electrical signal at the first side of the substrate.

9. The semiconductor device of claim 8, wherein:
the conductive structure further comprises a terminal layer over the redistribution structure;
the redistribution structure comprises lateral sides;
the terminal layer overlaps onto lateral sides of the redistribution structure;
the semiconductor component is attached to the redistribution structure in a flip-chip configuration; and
the redistribution structure is configured to route the electrical signal at the first side of the substrate in a second fan-out path extending from within the footprint of the semiconductor component to an outside the footprint of the semiconductor component.

10. A semiconductor device, comprising:
a substrate comprising:
  a first side;
  a second side opposite to the first side;
  a conductive structure; and
  a substrate encapsulant;
  wherein:
    the conductive structure comprises:
      a lead comprising a lead via comprising via lateral sides, a lead protrusion comprising a protrusion lateral side, and a lead trace comprising a trace lateral side;
      a first terminal layer coupled to the lead via adjacent to the first side of the substrate; and
      a second terminal layer coupled to the lead protrusion and the lead trace adjacent to the second side of the substrate;
      the lead protrusion comprises a protrusion bottom side adjacent to the second side of the substrate;
      the lead trace comprises a lead trace bottom side adjacent to the second side of the substrate;
      the protrusion bottom side and the lead trace bottom side are substantially coplanar;
      the via lateral sides comprise first concave shapes;
      the protrusion lateral side is defined by a second concave shape, the protrusion lateral side comprising a first height defined by where the protrusion lateral side terminates and adjoins the substrate encapsulant;
      the trace lateral side is defined by a third concave shape, the trace lateral side comprising a second height defined by where the trace lateral side terminates adjoining the substrate encapsulant, wherein the second height is less than the first height;
      the substrate encapsulant covers the via lateral sides at the first side of the substrate but not the protrusion lateral side or the trace lateral side so that the lead protrusion and the lead trace protrude from the substrate encapsulant at the second side of the substrate;
      the second terminal layer comprises a plated conformal layer that contacts the protrusion lateral side, the trace lateral side, the lead trace bottom side, and the protrusion bottom side without an intervening layer;
      the first terminal layer and the lead via define an internal terminal; and
      the second terminal layer, the lead protrusion, and the lead trace define an external terminal;
  a semiconductor component adjacent to the first side of the substrate, electrically coupled to the internal terminal, and comprising:
    a first component side distal to the first side of the substrate;
    a second component side proximate to the first side of the substrate; and
    lateral component sides extending between the first component side and the second component side to define a footprint of the semiconductor component; and
  a body encapsulant encapsulating the first component side and the lateral component sides of the semiconductor component;
wherein:
the body encapsulant comprises a body encapsulant top side and a body encapsulant bottom side;
the substrate encapsulant comprises a substrate encapsulant top side proximate to the first side of the substrate;
the body encapsulant bottom side contacts the substrate encapsulant top side; and
the lead trace is configured to laterally route an electrical signal at the second side of the substrate in either:
  a fan-in electrical signal path where the lead trace is connected to the lead protrusion at a first location outside of the footprint and laterally extends to a second location within the footprint; or
  a fan-out electrical signal path where the lead trace is connected to the lead protrusion at a third location inside of the footprint and laterally extends to a fourth location outside of the footprint.

11. The semiconductor device of claim 10, wherein:
the lead via comprises a lead via top side;
the trace lateral side is laterally separated from the lead via so that at least a portion of the lead trace bottom side is external to and is not overlapped by the lead via top side in a top plan view;
the substrate encapsulant is interposed between the lead trace and the semiconductor component;
the lead trace comprises the fan-in electrical signal path;
the via lateral sides are separated by a first lateral width in a cross-sectional view; and
the protrusion lateral side and the trace lateral side are separated by a second lateral width in the cross-sectional view that is greater than the first lateral width.

12. The semiconductor device of claim 11, wherein:
the conductive structure further comprises a redistribution structure coupled to the lead via at the first side of the substrate;
the redistribution structure is interposed between the lead via and the first terminal layer;
the redistribution structure laterally extends along the substrate encapsulant to overlap at least one of the via lateral sides in its entirety;
the semiconductor component is attached to the redistribution structure in a flip-chip configuration; and
the redistribution structure is configured to laterally route an electrical signal at the first side of the substrate in one or more of:
a) a second fan-in path that routes the electrical signal within the footprint of the semiconductor component; or
b) a second fan-out path that outwardly routes the electrical signal to an outside of the footprint of the semiconductor component.

13. The semiconductor device of claim 10, wherein:
the lead trace comprises the fan-out electrical signal path.

14. The semiconductor device of claim 10, wherein:
the lead via has a first thickness; and
the lead protrusion has a second thickness that is different than the first thickness.

* * * * *